(12) United States Patent
Choi et al.

(10) Patent No.: US 12,557,282 B2
(45) Date of Patent: Feb. 17, 2026

(54) SEMICONDUCTOR DEVICE AND MANUFACTURING METHOD OF THE SEMICONDUCTOR DEVICE

(71) Applicant: SK hynix Inc., Icheon-si (KR)

(72) Inventors: Won Geun Choi, Icheon-si (KR); Jung Shik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 673 days.

(21) Appl. No.: 17/895,398

(22) Filed: Aug. 25, 2022

(65) Prior Publication Data

US 2023/0301092 A1   Sep. 21, 2023

(30) Foreign Application Priority Data

Mar. 18, 2022   (KR) .................. 10-2022-0034219

(51) Int. Cl.
| | |
|---|---|
| *H10B 43/27* | (2023.01) |
| *H01L 23/528* | (2006.01) |
| *H10B 41/10* | (2023.01) |
| *H10B 41/27* | (2023.01) |
| *H10B 43/10* | (2023.01) |

(52) U.S. Cl.
CPC ......... *H10B 43/27* (2023.02); *H01L 23/5283* (2013.01); *H10B 41/10* (2023.02); *H10B 41/27* (2023.02); *H10B 43/10* (2023.02)

(58) Field of Classification Search
CPC ........ H10B 43/27; H10B 41/10; H10B 41/27; H10B 43/10; H10B 41/30; H10B 41/50; H10B 43/30; H10B 43/50; H01L 23/5283
See application file for complete search history.

(56) References Cited

U.S. PATENT DOCUMENTS

| | | | |
|---|---|---|---|
| 8,748,971 | B2 | 6/2014 | Tanaka et al. |
| 9,147,681 | B2 | 9/2015 | Liu |
| 2009/0317749 | A1* | 12/2009 | Lee ............ G03F 7/20 430/319 |
| 2018/0182776 | A1* | 6/2018 | Kim .......... H10D 30/693 |
| 2020/0343307 | A1* | 10/2020 | Lee ............ H10B 63/84 |
| 2021/0020203 | A1* | 1/2021 | Choi .......... G11C 5/063 |

FOREIGN PATENT DOCUMENTS

KR   1020210010210 A   1/2021

* cited by examiner

*Primary Examiner* — Galina G Yushina
(74) *Attorney, Agent, or Firm* — WILLIAM PARK AND ASSOCIATES LTD.

(57) ABSTRACT

A semiconductor device, and a method of manufacturing the semiconductor device, includes: a gate structure including conductive layers and insulating layers, which are alternately stacked; a channel structure including a first channel structure and a second channel structure aligned in a first direction, and the channel structure penetrating the gate structure, a first cutting structure extending in a second direction, the first cutting structure disposed between the first channel structure and the second channel structure; a contact pad including a first contact pad in contact with an upper surface of the first channel structure, and a second contact pad in contact with an upper surface of the second channel structure; a second cutting structure in contact with an upper surface of the first cutting structure and disposed between the first contact pad and the second contact pad, wherein the first contact pad has a critical dimension greater than a critical dimension of the upper surface of the first channel structure.

17 Claims, 29 Drawing Sheets

SEMICONDUCTOR DEVICE AND MANUFACTURING METHOD OF THE SEMICONDUCTOR DEVICE

CROSS-REFERENCE TO RELATED APPLICATION

The present application claims priority under 35 U.S.C. § 119(a) to Korean patent application number 10-2022-0034219 filed on Mar. 18, 2022, in the Korean Intellectual Property Office, the entire disclosure of which is incorporated by reference herein.

BACKGROUND

1. Technical Field

The present disclosure generally relates to an electronic device, and more particularly, to a semiconductor device and a manufacturing method of a semiconductor device.

2. Related Art

A nonvolatile memory device is a memory device in which stored data is retained even when the supply of power is interrupted. As the improvement of the degree of integration of two-dimensional nonvolatile memory devices in which memory cells are formed in the form of a single layer over a substrate reaches its limit, there has recently been proposed a three-dimensional nonvolatile memory device in which memory cells are stacked vertically over a substrate.

The three-dimensional nonvolatile memory device includes interlayer insulating layers and gate electrodes, which are alternately stacked, and channel layers penetrating the interlayer insulating layers and the gate electrodes, and memory cells are stacked along the channel layers. Various structures and various manufacturing methods have been developed so as to improve the operational reliability of such a nonvolatile memory device having a three-dimensional structure.

SUMMARY

Some embodiments are directed to a semiconductor device having a stable structure and improved operating characteristics, and a manufacturing method of such a semiconductor device.

In accordance with an embodiment of the present disclosure, a semiconductor device includes: a gate structure including conductive layers and insulating layers, which are alternately stacked; at least one channel structure penetrating the gate structure, the at least one channel structure being aligned in a first direction; a first cutting structure extending in the first direction, the first cutting structure penetrating the at least one channel structure; a contact pad in contact with an upper surface of the at least one channel structure, the contact pad having a critical dimension greater than a critical dimension of the upper surface of the at least one channel structure; and a second cutting structure in contact with an upper surface of the first cutting structure and penetrating the contact pad.

In accordance with another embodiment of the present disclosure, a semiconductor device includes: a gate structure including conductive layers and insulating layers, which are alternately stacked; a pillar structure penetrating the gate structure; a first cutting structure penetrating the pillar structure, the first cutting structure separating the pillar structure into a first pillar structure and a second pillar structure isolated from the first pillar structure; a first contact pad in contact with an upper surface of the first pillar structure, the first contact pad having a critical dimension greater than a critical dimension of the upper surface of the first pillar structure; a second contact pad in contact with an upper surface of the second pillar structure, the second contact pad having a critical dimension greater than a critical dimension of the upper surface of the second pillar structure; and a second cutting structure disposed between the first contact pad and the second contact pad to isolate the first contact pad and the second contact pad from each other, wherein the second cutting structure is disposed on the top of the first cutting structure, and a critical dimension of the second cutting structure is smaller than a critical dimension of the first cutting structure.

Also in accordance with the present disclosure is a method of manufacturing a semiconductor device. The method includes: forming a stack structure; forming at least one channel structure penetrating the stack structure, the at least one channel structure being aligned in a first direction; forming a first cutting structure extending in the first direction and penetrating the at least one channel structure; forming an interlayer insulating layer on the stack structure, and forming an opening through which an upper surface of the at least one channel structure is exposed by etching the interlayer insulating layer; forming a conductive pattern by filling the opening with a conductive material; and forming a second cutting structure separating the conductive pattern into a first contact pad and a second contact pad isolated from the first contact pad, the second cutting structure penetrating the conductive pattern and formed on the top of the first cutting structure.

Further in accordance with the present disclosure is another method of manufacturing a semiconductor device. The method includes: forming a stack structure; forming channel structures penetrating the stack structure, the channel structures being aligned in a first direction; forming a first cutting structure continuously penetrating the channel structures, the first cutting structure extending in the first direction; forming an interlayer insulating layer on the stack structure, and forming openings through which upper surfaces of the channel structures are exposed by etching the interlayer insulating layer; filling the openings with sacrificial patterns, and forming a mask pattern on the top of the sacrificial patterns overlapping the first cutting structure; exposing the channel structures by etching the sacrificial patterns in the openings through an etching process using the mask pattern; forming contact pads in contact with the exposed upper surfaces of the channel structures in spaces in which the sacrificial patterns are etched; and removing the mask pattern and the sacrificial patterns remaining on the bottom of the mask pattern, and forming a second cutting structure in spaces in which the sacrificial patterns are removed.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it

DETAILED DESCRIPTION

The specific structural or functional descriptions disclosed herein are merely illustrative for the purpose of describing embodiments according to the concept of the present disclosure. The embodiments according to the concept of the present disclosure can be implemented in various forms, and should not be construed as being limited to the embodiments set forth herein.

Figure 1:
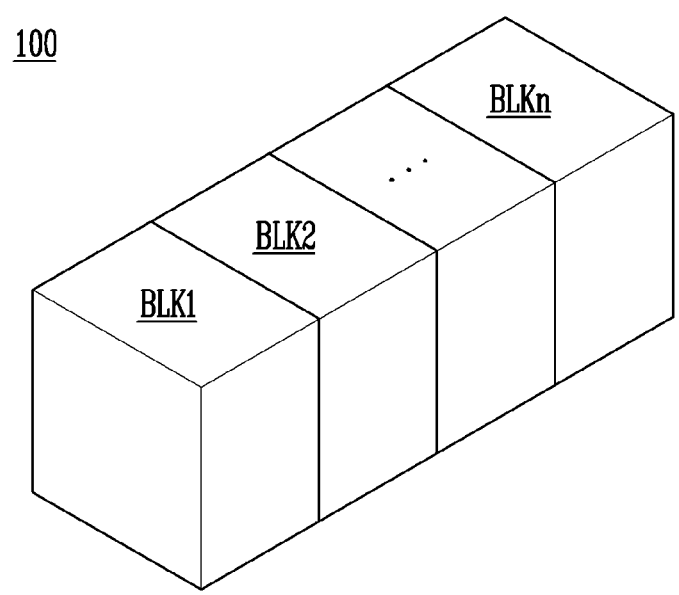
FIG. 1 is a block diagram illustrating a semiconductor device in accordance with an embodiment of the present disclosure.

FIG. 1 is a block diagram illustrating a semiconductor device 100 in accordance with an embodiment of the present disclosure.

Referring to FIG. 1, the semiconductor device 100 may include a plurality of memory blocks BLK1 to BLKn.

Each of the memory blocks BLK1 to BLKn may include a source line, bit lines, memory cell strings electrically connected to the source line and the bit lines, word lines electrically connected to the memory cell strings, and select lines electrically connected to the memory cell strings. Each of the memory cell strings may include memory cells and select transistors, which are connected in series by a channel pattern. The select lines and the word lines may be used as gate electrodes of the select transistors and the memory cells.

Figure 2A:
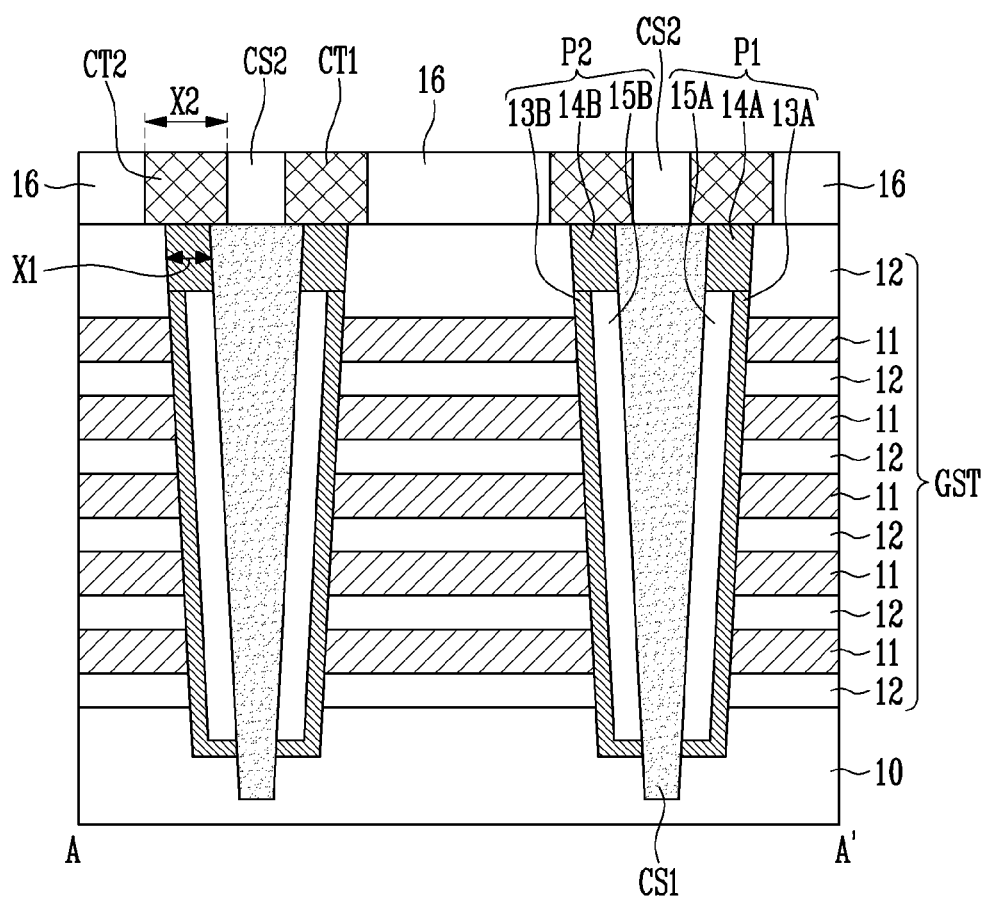
FIGS. 2A to 2D are views illustrating a structure of a semiconductor device in accordance with an embodiment of the present disclosure.
Figure 2B:
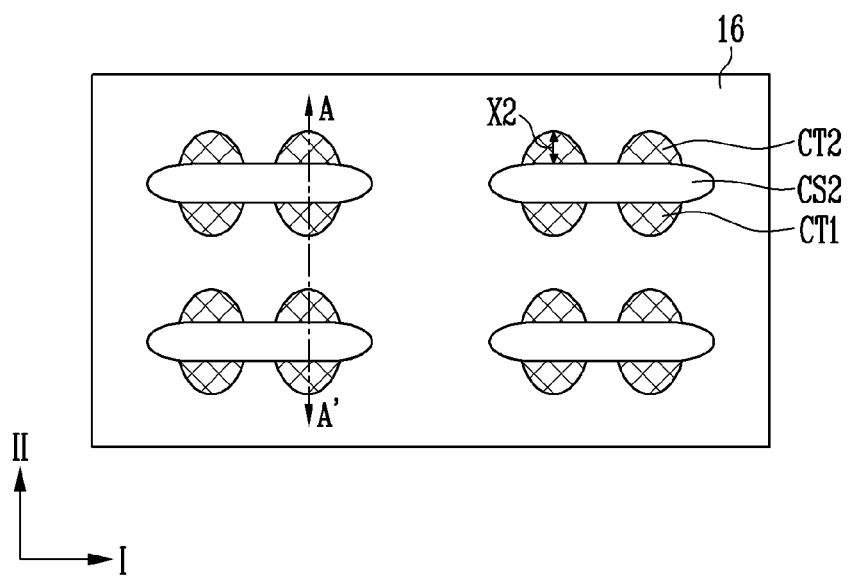
Figure 2C:
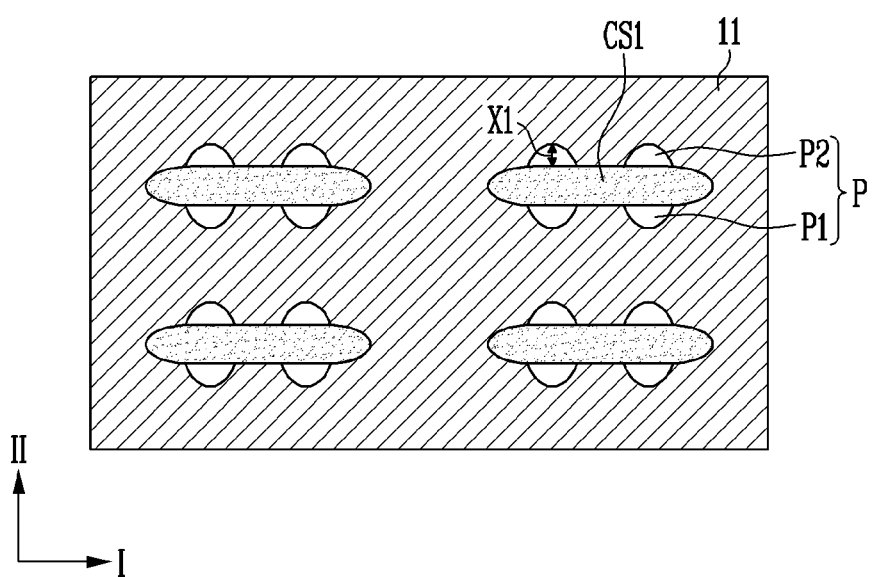

FIGS. 2A to 2D are views illustrating a structure of a semiconductor device in accordance with an embodiment of the present disclosure. FIG. 2A is a sectional view of memory strings included in the semiconductor device, and FIG. 2B is a layout view of a layer in which an interlayer insulating layer 16 shown in FIG. 2A is disposed. In addition, FIG. 2C is a layout view of a layer in which a conductive layer 11 shown in FIG. 2A is disposed.

Referring to FIGS. 2A to 2C, the semiconductor device may include a gate structure GST, pillar structures P, first and second cutting structures CS1 and CS2, and first and second contact pads CT1 and CT2. The semiconductor device may further include a base 10 and first and second slit structures (not shown), or further include a combination thereof.

The gate structure GST may include conductive layers 11 and insulating layers 12, which are alternately stacked. The conductive layers 11 may be gate electrodes of a memory cell, a select transistor, and the like. The conductive layers 11 may include a conductive material such as poly-silicon, tungsten, molybdenum, or metal. The insulating layers 12 may be used to insulate the stacked conductive layers 11 from each other. The insulating layers 12 may include an insulating material such as an oxide, a nitride, an air gap, etc.

The gate structure GST may be located on the base 10. The base 10 may be a semiconductor substrate, a source layer, or the like. The semiconductor substrate may include a source region doped with an impurity. The source layer may include a conductive material such as poly-silicon, tungsten, molybdenum, metal, etc.

The pillar structures P may penetrate the gate structure GST. The pillar structures P may be arranged in a first direction I as a horizontal direction of the base 10 and a second direction II intersecting the first direction I. In an embodiment, the pillar structures P may be arranged in a matrix form.

Each of the pillar structures P may include a pair of first and second pillar structures P1 and P2. By the first cutting structure CS1, the pillar structure P may be isolated into a pair of first and second pillar structures P1 and P2. The pair of first and second pillar structures P1 and P2 may be adjacent to each other in the second direction II with the first cutting structure CS1 interposed therebetween, and have structures symmetrical to each other with respect to the first cutting structure CS1.

In an embodiment, the pillar structures P may be channel structures including channel layers 13A and 13B. The first pillar structure P1 may be a first channel structure, and the second pillar structure P2 may be a second channel structure. First memory cells or select transistors may be located at positions at which the pillar structure P1 and the conductive layers 11 intersect each other, and second memory cells or select transistors may be located at positions at which the second pillar structure P2 and the conductive layers 11 intersect each other. A first memory cell and a second memory cell, which are adjacent to each other with the first cutting structure CS1 interposed therebetween, may be individually driven.

The first pillar structure P1 may include a first channel layer 13A. The first channel layer 13A may occupy a region in which a channel of a memory cell, a select transistor, or the like is formed. The first channel layer 13A may include a semiconductor material, such as silicon or germanium. The first pillar structure P1 may further include a first conductive pad 14A. The first conductive pad 14A may be connected to the first channel layer 13A and include a conductive material. The pillar structure P1 may further include a first insulating core 15A. The first insulating core 15A may include an insulating material such as an oxide, a nitride, an air gap, etc. The first pillar structure P1 may further include a memory layer (not shown) located between the first channel layer 13A and the conductive layers 11. The memory layer may include at least one of a tunneling layer, a data storage layer, and a blocking layer. The data storage layer may include a floating gate, a charge trap material, poly-silicon, a nitride, a variable resistance material, or a nano structure, or include any combination thereof.

The second pillar structure P2 may have a structure similar to the structure of the first pillar structure P1. The second pillar structure P2 may include a second channel layer 13B. The second pillar structure P2 may further include a second conductive pad 14B or a second insulating core 15B, or further include a combination thereof.

The first cutting structure CS1 may penetrate the pillar structures P, and extend to the base 10. The first cutting structure CS1 may penetrate the gate structure GST and the pillar structures P, and extend in the first direction I. The first cutting structure CS1 may continuously penetrate at least two pillar structures. The first cutting structure CS1 may traverse at least two pillar structures P arranged in the first direction I, and separate one pillar structure P into a first pillar structure P1 and a second pillar structure P2 isolated from each other. The first cutting structure CS1 may include an insulating material such as an oxide, a nitride, an air gap, etc.

The interlayer insulating layer 16 may be disposed on the gate structure GST. The first contact pad CT1 in contact with the first pillar structure P1 while penetrating the interlayer insulating layer 16 and the second contact pad CT2 in contact with the second pillar structure P2 while penetrating the interlayer insulating layer 16 may be disposed in the interlayer insulating layer 16. One first contact pad CT1 and one second contact pad CT2 may be defined as a pair of contact pads. By the second cutting structure CS2, one contact pad may be isolated into a first contact pad CT1 and a second contact pad. A pair of first and second contact pads CT1 and CT2 may be adjacent to each other in the second direction II with the second cutting structure CS2 interposed therebetween. The first and second contact pads CT1 and CT2 may have structures symmetrical to each other with respect to the second cutting structure CS2.

The second cutting structure CS2 may be disposed on the top of the first cutting structure CS1 and overlap with the first cutting structure CS1. A width of the second cutting structure CS2 in the second direction II may be narrower than a width of the first cutting structure CS1 in the second direction II. In addition, the first contact pad CT1 may be in contact with an uppermost surface of the first pillar structure P1. A critical dimension X2 of the first contact pad CT1 may be greater than a critical dimension X1 of an uppermost surface of the first pillar structure P1. In addition, the second contact pad CT2 may be in contact with an uppermost surface of the second pillar structure P2, and a critical dimension X2 of the second contact pad CT2 may be greater than a critical dimension X1 of an uppermost surface of the second pillar structure P2. That is, the first contact pad CT1 and the second contact pad CT2 have a critical dimension greater than a critical dimension of the first pillar structure P1 and the second pillar structure P2, so that an overlapping margin is increased in a contact plug forming process of connecting the first contact pad CT1 and the second contact pad CT2 to bit lines.

Figure 2D:
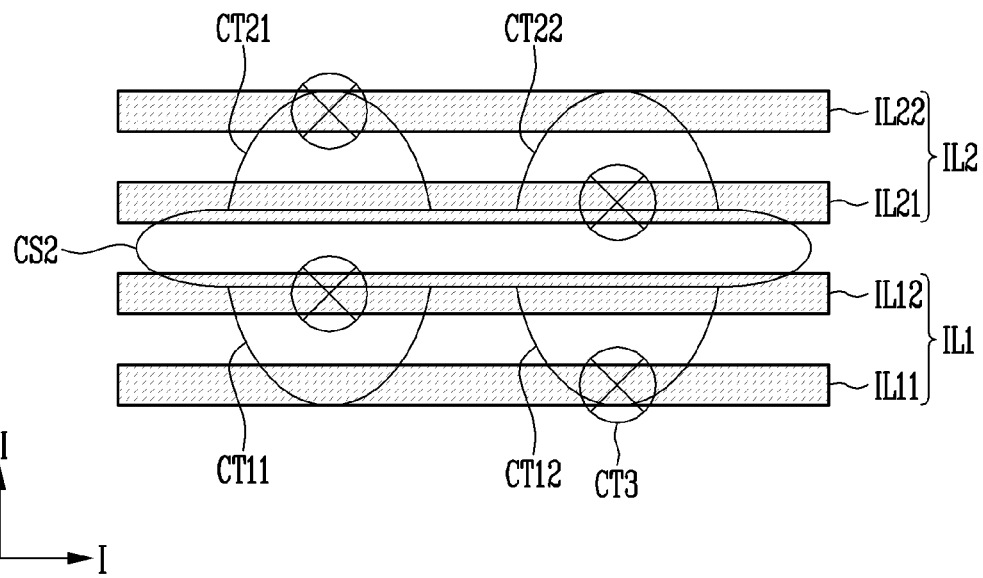

FIG. 2D is a layout view illustrating interconnection lines disposed on the top of the memory strings shown in FIG. 2A.

Referring to FIGS. 2B and 2D, the semiconductor device may further include a first interconnection line IL1 and a second interconnection line IL2. The first interconnection line IL1 and the second interconnection line IL2 may extend in the first direction I. The first interconnection line IL1 and the second interconnection line IL2 may be parallel to the second cutting structure CS2.

In an embodiment, a first contact pad CT11 may be connected to a first interconnection line IL12 through a contact plug CT3, a first contact pad CT12 may be connected to a first interconnection line IL11 through a contact plug CT3, a second contact pad CT21 may be connected to a second interconnection line IL22 through a contact plug CT3, and a second contact pad CT22 may be connected to a second interconnection line IL21 through a contact plug CT3. In an embodiment, the contact plugs CT3 may be located at different levels. That is, the contact plugs CT3 may be disposed at different levels of the second direction II to respectively correspond to a plurality of first interconnection lines IL1 and a plurality of second interconnection lines IL2, which are disposed to extend in the first direction I.

Although a case where contact plugs adjacent to each other in the second direction II may be disposed on the same line in the second direction II has been illustrated in the above-described embodiment, the present disclosure is not limited thereto, and the contact plugs adjacent to each other in the second direction II may be disposed in a diagonal direction. In an embodiment, contact plugs adjacent to each other in the first direction I or the second direction II may be disposed such that a distance between the contact plugs is maximally wide.

According to the structure described above, one pillar structure P may be isolated into a plurality of pillar structures P1 and P2 by using the first cutting structure CS1. Thus, the number of memory cells implemented with one pillar structure P can be increased. Although the stacked number of conductive layers 11 included in the gate structure GST is not increased, the number of memory cells included in the gate structure GST can be increased. In addition, a first pillar structure P1 and a second pillar structure P2 are not directly connected to contact plugs CT3, but the first contact pad CT1 and the second contact pad CT2, which has a critical dimension greater than a critical dimension of the first pillar structure P1 and the second pillar structure P2, are disposed on the top of the first pillar structure P1 and the second pillar structure P2, and the contact plugs CT3 are connected to the first contact pad CT1 and the second contact pad CT2. Thus, a process for forming contact plugs can be more easily performed.

Figure 3A:
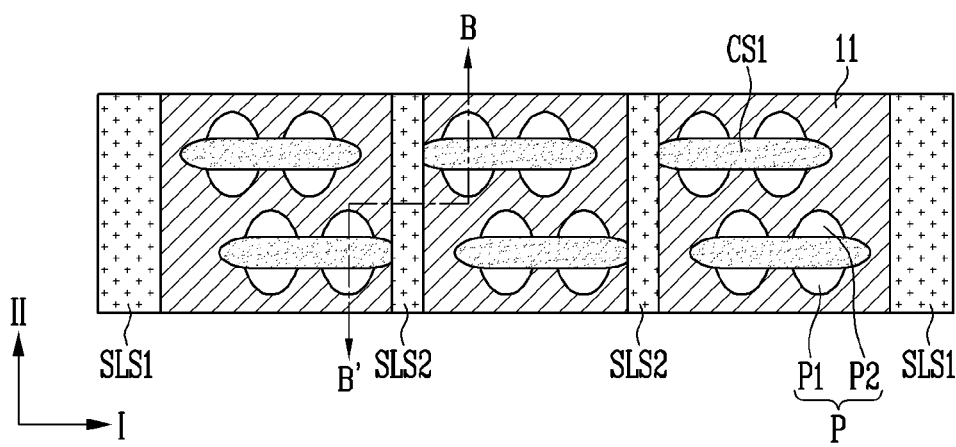
FIGS. 3A and 3B are views illustrating a structure of a semiconductor device in accordance with another embodiment of the present disclosure.
Figure 3B:
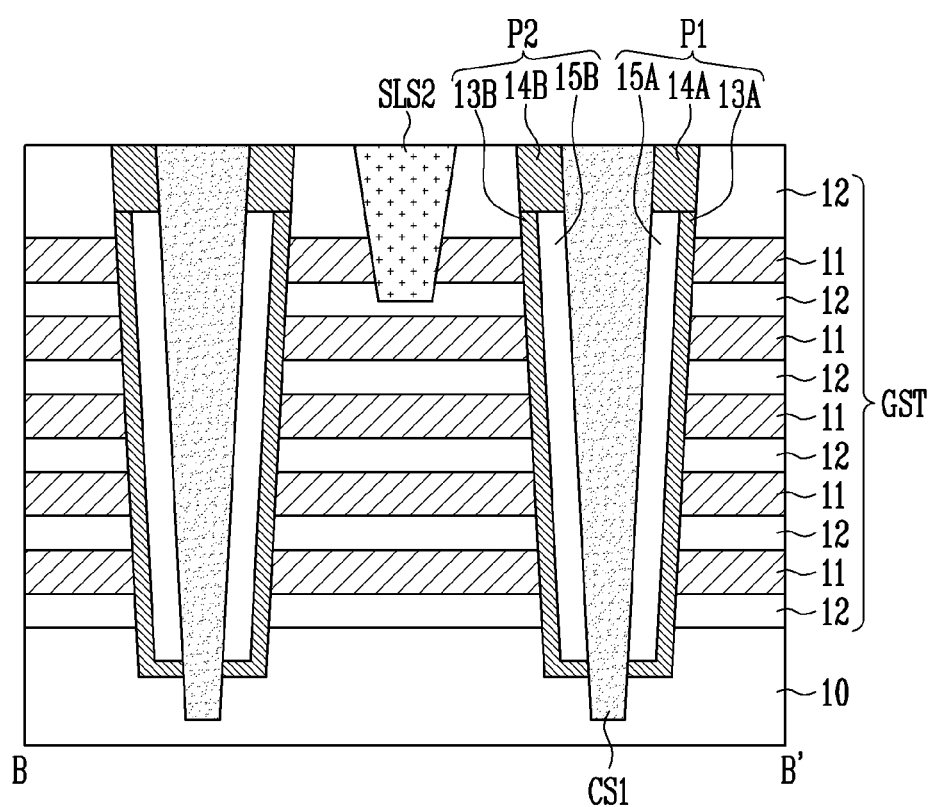

FIGS. 3A and 3B are views illustrating a structure of a semiconductor device in accordance with another embodiment of the present disclosure. Hereinafter, redundant descriptions of portions already described above will be omitted.

Referring to FIGS. 3A and 3B, the semiconductor device may include a gate structure GST, pillar structures P, a first cutting structure CS1, a first slit structure SLS1, and a second slit structure SLS2. The semiconductor device may further include, on the gate structure GST, an interlayer insulating layer 16, a second cutting structure CS2, a first contact pad CT1 and a second contact pad CT2, a plurality of contact plugs CT3, and a first interconnection line IL1 and a second interconnection line IL2 as shown in FIGS. 2A and 2D.

The pillar structures P may be arranged in a form in which the centers of the pillar structures P are dislocated from each other. In an embodiment, the centers of pillar structures P adjacent to each other in the first direction I may be in alignment, and the centers of pillar structures P adjacent to each other in the second direction II may be out of alignment, as pictured in FIG. 3A.

First cutting structures CS1 may be arranged in a form in which the centers of the first cutting structures CS1 are dislocated from each other. In an embodiment, the centers of first cutting structures CS1 adjacent to each other in the first direction I may be in alignment, and the centers of first cutting structures CS1 adjacent to each other in the second direction II may be out of alignment, as pictured in FIG. 3A.

A plurality of first cutting structures CS1 may be located between a pair of first slit structures SLS1. The first cutting structures CS1 may be arranged in the first direction I and the second direction II. In an embodiment, the first cutting structures CS1 may be arranged in a matrix form.

The first slit structure SLS1 may penetrate the gate structure GST. The first slit structure SLS1 may extend in a direction intersecting the first cutting structure CS1. The first slit structure SLS1 may extend in the second direction II. In an embodiment, the first slit structure SLS1 may be arranged to be orthogonal to the first cutting structure CS1. The first slit structure SLS1 may include an insulating material. In an embodiment, the first slit structure SLS1 may include a contact structure electrically connected to a base 10 and an insulating spacer insulating the contact structure and conductive layers 11 from each other.

The second slit structure SLS2 may penetrate the gate structure GST to a depth shallower than a depth of the first slit structure SLS1 or the first cutting structure CS1. The second slit structure SLS2 may have a depth to which the second slit structure SLS2 penetrates at least one conductive layer 11 at an uppermost portion among the conductive layers 11. In an embodiment, the second slit structure SLS2 may have a depth to which the second slit structure SLS2 penetrates at least one conductive layer 11 corresponding to a select line among the conductive layers 11 and does not penetrate any conductive layers 11 corresponding to word lines among the conductive layers 11.

At least one second slit structure SLS2 may be located between a pair of first slit structures SLS1. The second slit structure SLS2 may extend in a direction intersecting the first cutting structure CS1. The second slit structure SLS2 may extend in parallel to the first slit structure SLS1. The second slit structure SLS2 may extend in the second direction II. First cutting structures CS1 may be symmetrically or asymmetrically disposed at both sides of the second slit structure SLS2. The second slit structure SLS2 may be in contact with at least one first cutting structure CS1. Pillar structures P may be located between the first slit structure SLS1 and the second slit structure SLS2. Some of the pillar structures P may be in contact with the second slit structure SLS2.

Figure 4A:
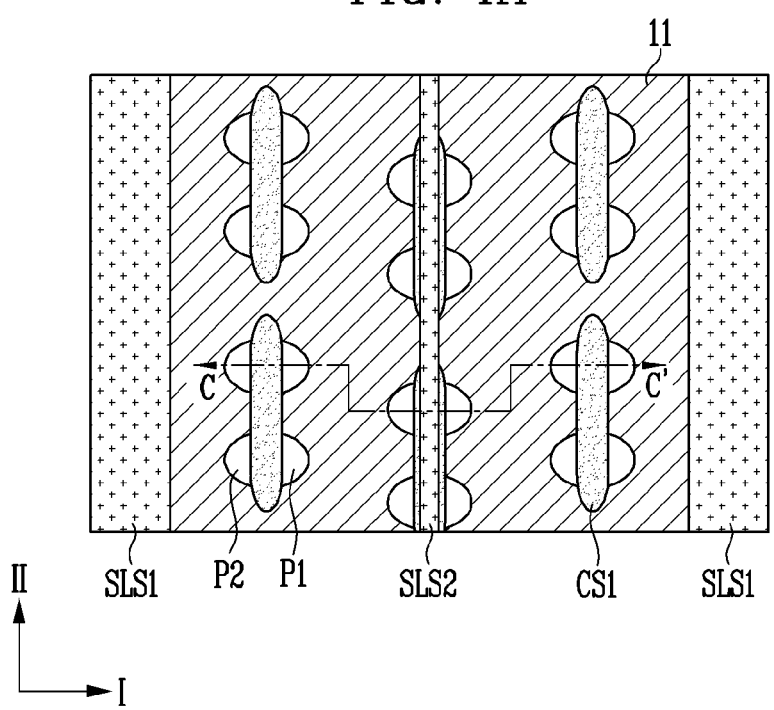
FIGS. 4A and 4B are views illustrating a structure of a semiconductor device in accordance with still another embodiment of the present disclosure.
Figure 4B:
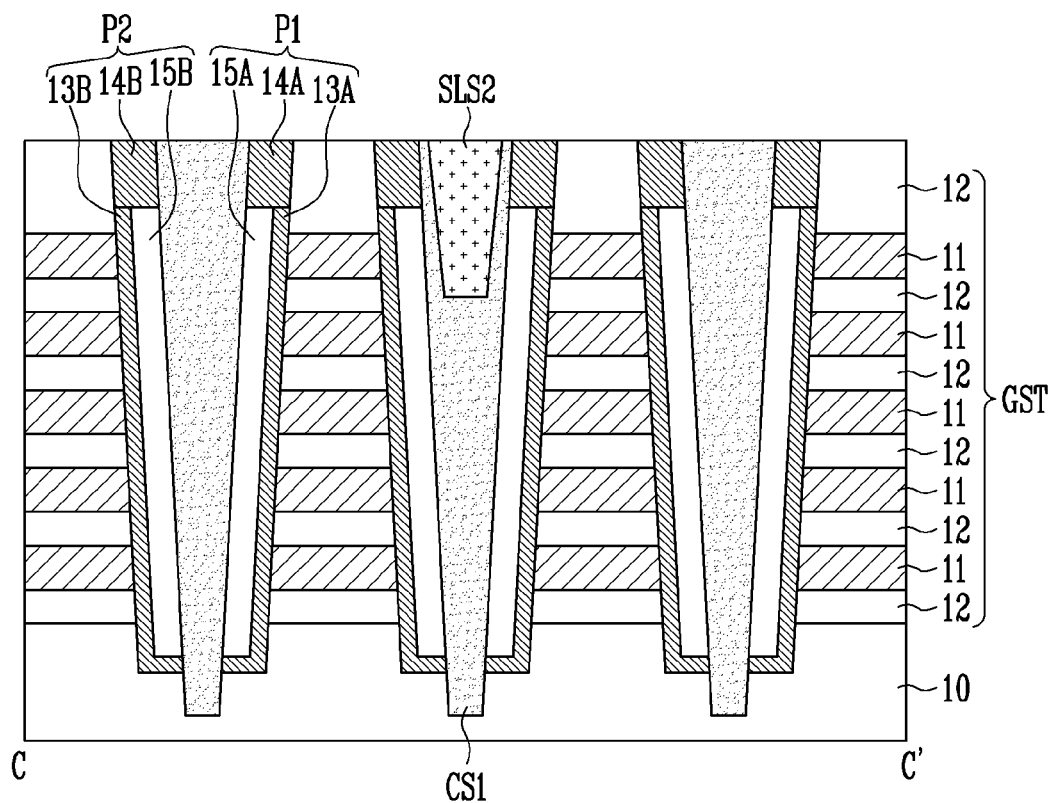

FIGS. 4A and 4B are views illustrating a structure of a semiconductor device in accordance with still another embodiment of the present disclosure. Hereinafter, redundant descriptions of portions already described above will be omitted.

Referring to FIGS. 4A and 4B, the semiconductor device may include a gate structure GST, pillar structures P, a first cutting structure CS1, a first slit structure SLS1, and a second slit structure SLS2. The semiconductor device may further include, on the gate structure GST, an interlayer insulating layer 16, a second cutting structure CS2, a first contact pad CT1 and a second contact pad CT2, a plurality of contact plugs CT3, and a first interconnection line IL1 and a second interconnection line IL2 as shown in FIGS. 2A and 2D.

The pillar structures P may be arranged in a form in which the centers of the pillar structures P are dislocated from each other. In an embodiment, the centers of pillar structures P adjacent to each other in the second direction II may be in alignment, and the centers of pillar structures P adjacent to each other in the first direction I may be out of alignment, as pictured in FIG. 4A.

First cutting structures CS1 may be arranged in a form in which the centers of the first cutting structures CS1 are dislocated from each other. In an embodiment, the centers of first cutting structures CS1 adjacent to each other in the second direction II may be in alignment, and the centers of first cutting structures CS1 adjacent to each other in the first direction may be out of alignment, as pictured in FIG. 4A.

A plurality of first cutting structures CS1 may be located between a pair of first slit structures SLS1. The first cutting structures CS1 may be arranged in the first direction I and the second direction II. In an embodiment, the first cutting structures CS1 may be arranged in a matrix form.

The first slit structure SLS1 may penetrate the gate structure GST. The first slit structure SLS1 may extend in a direction parallel to the first cutting structure CS1. The first slit structure SLS1 may extend in the second direction II. In an embodiment, the first slit structure SLS1 may include an insulating material. In an embodiment, the first slit structure SLS1 may include a contact structure electrically connected to a base 10 and an insulating spacer insulating the contact structure and conductive layers 11 from each other.

The second slit structure SLS2 may extend in a direction parallel to the first slit structure SLS1 and the first cutting structure CS1. The second slit structure SLS2 may extend in parallel to the first slit structure SLS1. The second slit structure SLS2 may penetrate the gate structure GST to a depth shallower than a depth of the first slit structure SLS1 or the first cutting structure CS1. In an embodiment, the second slit structure SLS2 may penetrate some first cutting structures CS1. In an embodiment, the second slit structure SLS2 may overlap with some first cutting structures CS1. The second slit structure SLS2 may have a depth to which the second slit structure SLS2 penetrates at least one conductive layer 11 at an uppermost portion among the conductive layers 11. In an embodiment, the second slit structure SLS2 may have a depth to which the second slit structure SLS2 penetrates at least one conductive layer 11 corresponding to a select line among the conductive layers 11 and does not penetrate any conductive layers 11 corresponding to word lines among the conductive layers 11.

First pillar structures P1 and second pillar structures P2, which are adjacent to the first slit structure SLS1, may be defined as dummy pillars. The first pillar structures P1 and second pillar structures P2, which are defined as the dummy pillars, might not be connected to any contact plugs. In addition, the first slit structure SLS1 may be disposed to penetrate the first pillar structures P1 and second pillar structures P2, which are defined as the dummy pillars.

Figure 5:
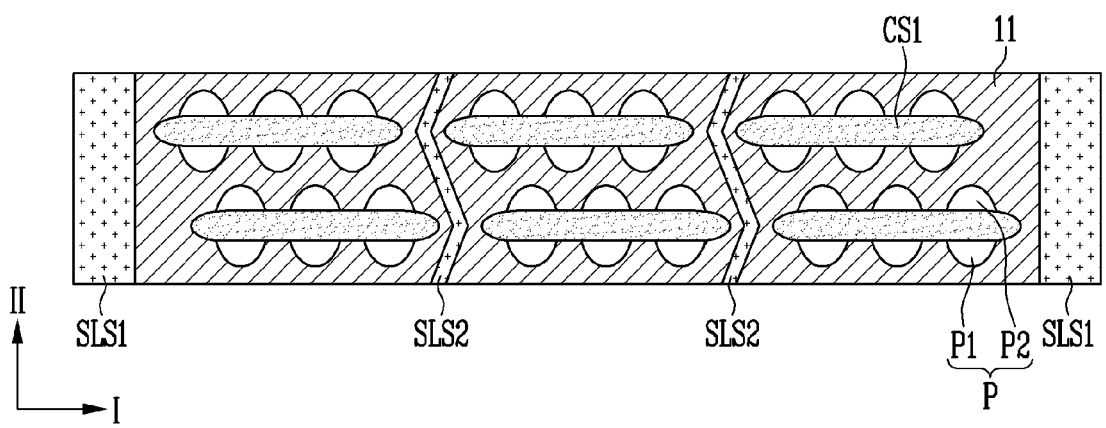
FIG. 5 is a view illustrating a structure of a semiconductor device in accordance with still another embodiment of the present disclosure.

FIG. 5 is a view illustrating a structure of a semiconductor device in accordance with still another embodiment of the present disclosure. Hereinafter, redundant descriptions of portions already described above will be omitted.

Referring to FIG. 5, the semiconductor device may include a gate structure, pillar structures P, a first cutting structure CS1, and a first slit structure SLS1. The semiconductor device may further include, on the gate structure, an interlayer insulating layer 16, a second cutting structure CS2, a first contact pad CT1 and a second contact pad CT2, a plurality of contact plugs CT3, and a first interconnection line IL1 and a second interconnection line IL2 as shown in FIGS. 2A and 2D.

The first cutting structure CS1 may penetrate three or more pillar structures P arranged in the first direction I. A second slit structure SLS2 may have a zigzag shape (shown), curve shape, wave shape, or other non-straight shape. The second slit structure SLS2 may be spaced apart from first cutting structures CS1 at both sides thereof.

FIGS. 6A, 6B, 7A, 7B, 8A, 8B, 9A, 9B, 9C, 10A, 10B, 11A, and 11B are views illustrating a manufacturing method of a semiconductor device in accordance with an embodiment of the present disclosure.

Figure 6A:
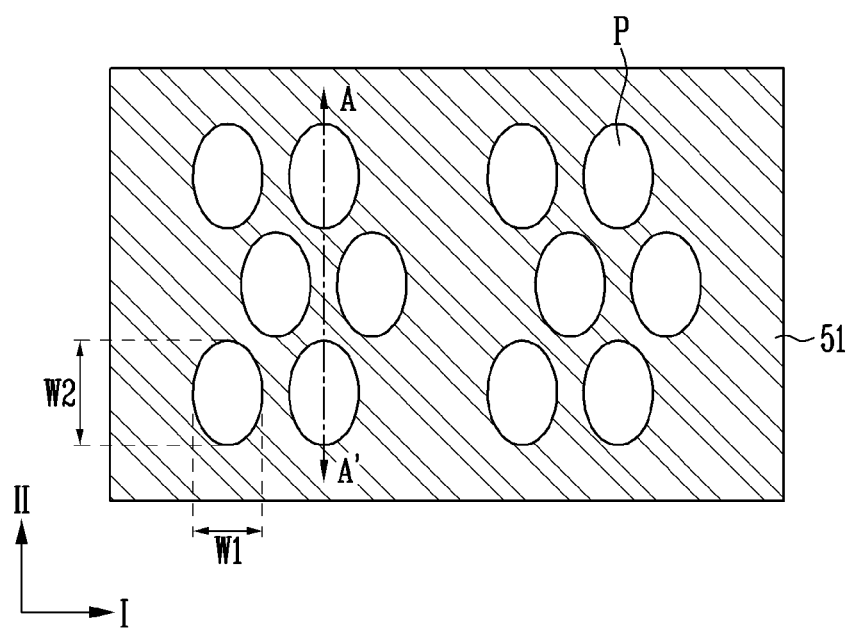
FIGS. 6A, 6B, 7A, 7B, 8A, 8B, 9A, 9B, 9C, 10A, 10B, 11A, and 11B are views illustrating a manufacturing method of a semiconductor device in accordance with an embodiment of the present disclosure.
Figure 6B:
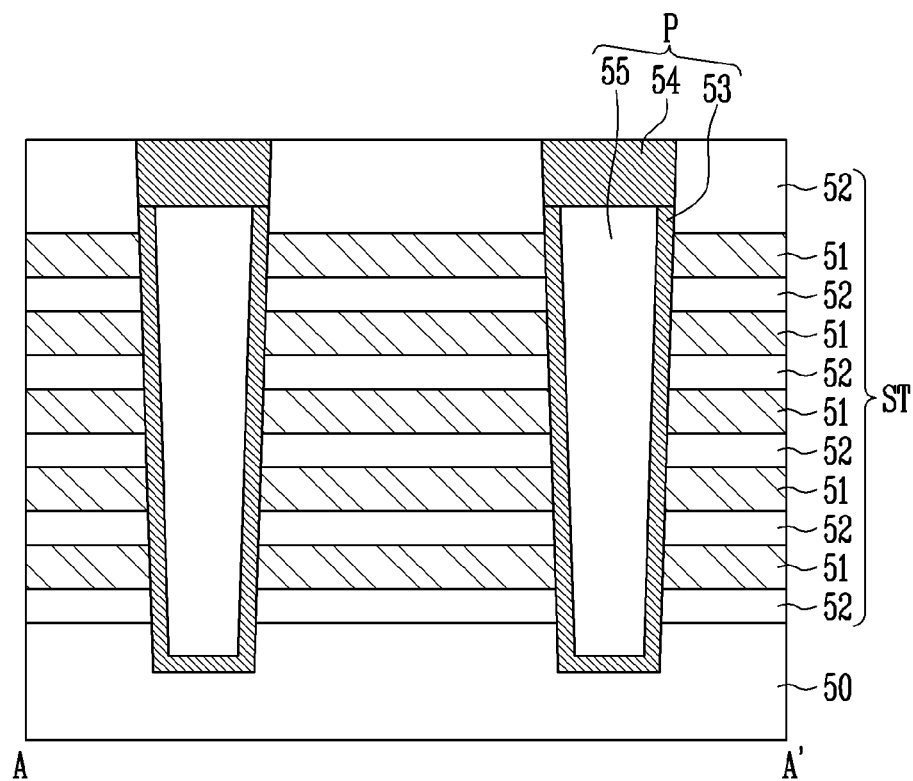

Referring to FIGS. 6A and 6B, a stack structure ST may be formed on a base 50. The base 50 may be a semiconductor substrate, a source structure, or the like. The semiconductor substrate may include a source region doped with an impurity. The source structure may include a source layer including a conductive material such as poly-silicon, tungsten, molybdenum or metal. Alternatively, the source structure may include a sacrificial layer to be replaced with the source layer in a subsequent process.

First material layers 51 and second material layers 52 may be alternately formed, thereby forming the stack structure ST. The first material layers 51 may include a material having a high etch selectivity with respect to the second material layers 52. In an example, the first material layers 51 may include a sacrificial material such as a nitride, and the second material layers 52 may include an insulating material such as an oxide. In another example, the first material layers 51 may include a conductive material such as poly-silicon, tungsten, or molybdenum, and the second material layers 52 may include an insulating material such as an oxide.

Subsequently, pillar structures P may be formed, which penetrate the stack structure ST. The pillar structures P may be arranged in a first direction I and a second direction II intersecting the first direction I. Pillar structures P adjacent to each other in the first direction I may be arranged such that the centers of the pillar structures P are in alignment. Adjacent pillar structures P arranged in the second direction II may be arranged such that the centers of the pillar structures P are out of alignment, as pictured in FIG. 6A.

On a plane defined in the first direction I and the second direction II, the pillar structure P may have a shape such as a circular shape, an elliptical shape, or a polygonal shape. In the plane of the pillar structure, P may have a first width W1 in the first direction I and have a second width W2 in the second direction II. The first width W1 and the second width W2 may be equal to or different from each other. The second width W2 may be wider than the first width W1 by considering a width of a cutting structure formed in a subsequent process.

The pillar structures P may include a channel layer 53. In an embodiment, after an opening penetrating the stack structure ST is formed, the channel layer 53 may be formed in the opening. A memory layer may be formed before the channel layer 53 is formed. Subsequently, after an insulating core 54 is formed, a conductive pad 55 may be formed. The pillar structures P may include an electrode layer instead of the channel layer 53. The insulating core 54 may be omitted, or the conductive pad 55 may be omitted.

Figure 7A:
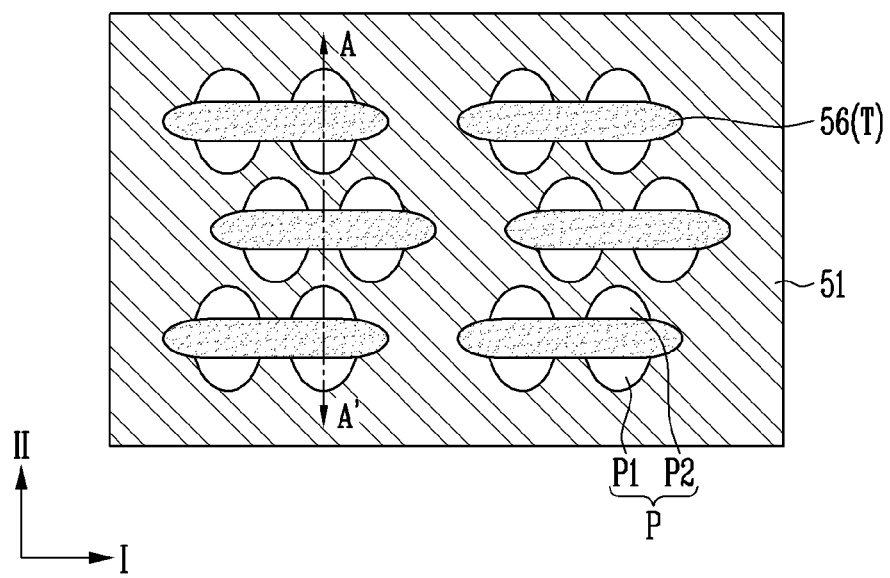
Figure 7B:
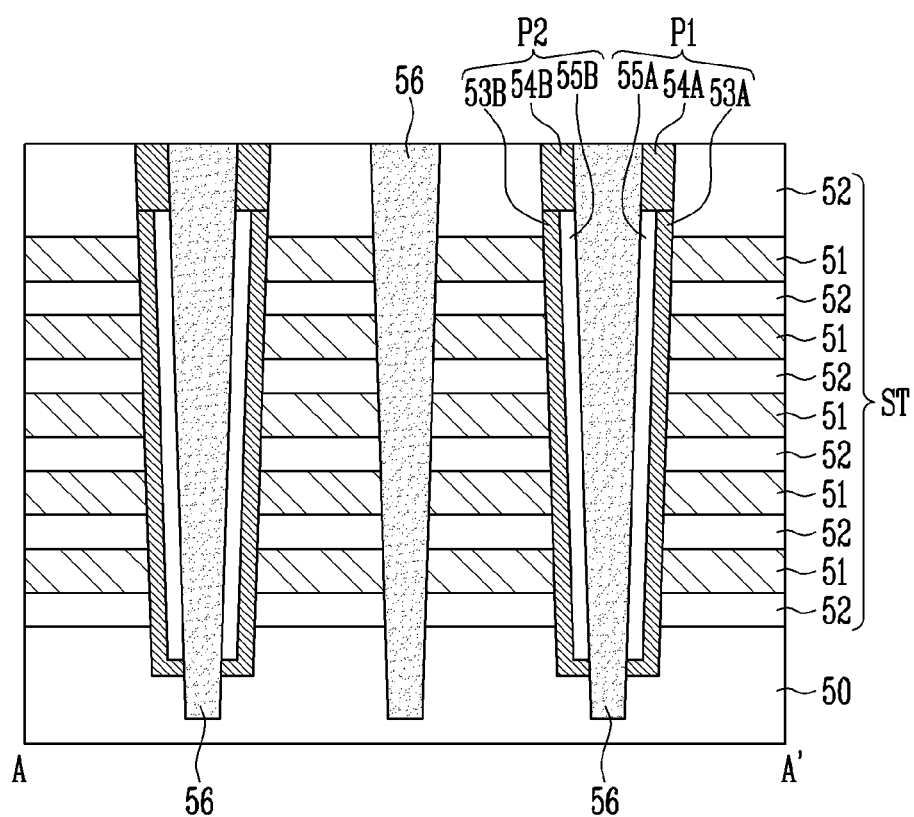

Referring to FIGS. 7A and 7B, first cutting structures 56 may be formed. Each of the first cutting structures 56 may extend in the first direction I while penetrating at least two pillar structures P. By the first cutting structures 56, each of the pillar structures P may be isolated into a first pillar structure P1 and a second pillar structure P2.

The first pillar structure P1 may be a first channel structure, and the second pillar structure P2 may be a second channel structure. The first pillar structure P1 may include a first channel layer 53A, a first conductive pad 54A, and a first insulating core 55A. The second pillar structure P2 may include a second channel layer 53B, a second conductive pad 54B, and a second insulating core 55B. Alternatively, the first pillar structure P1 may be a first electrode structure, and the second pillar structure P2 may be a second electrode structure. The first electrode structure may include a first electrode layer instead of the first channel layer 53A, and the second electrode structure may include a second electrode layer instead of the second channel layer 53B.

In an embodiment, trenches may be formed, which penetrate the stack structure ST and the pillar structures P. The trenches may have a depth to which the trenches completely penetrate the pillar structures P, and extend to the base 50. The trenches may extend in the first direction I to penetrate at least two pillar structures P. Subsequently, the first cutting structures 56 may be respectively formed in the trenches. The first cutting structures 56 are used to electrically isolate the first pillar structure P1 and the second pillar structure P2 from each other, and may include an insulating material.

Figure 8A:
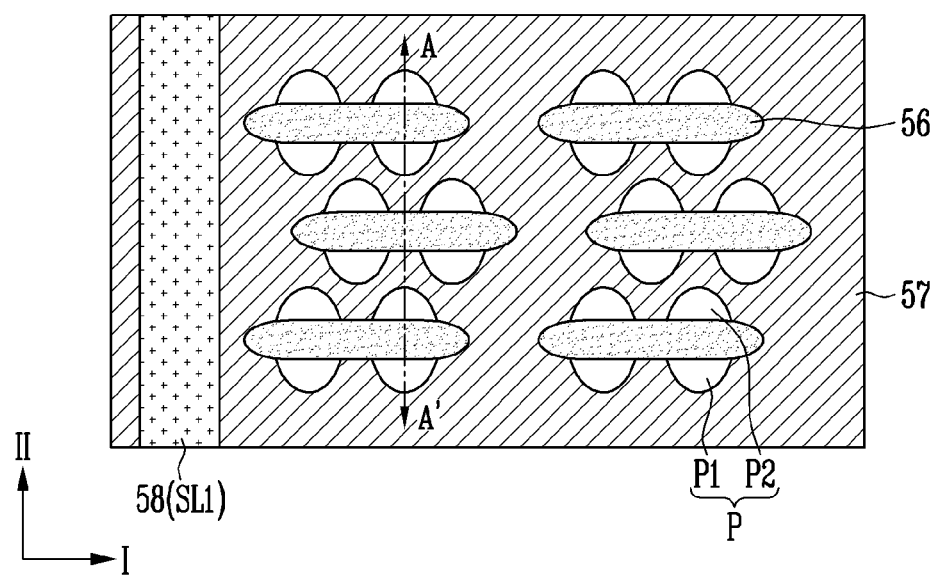
Figure 8B:
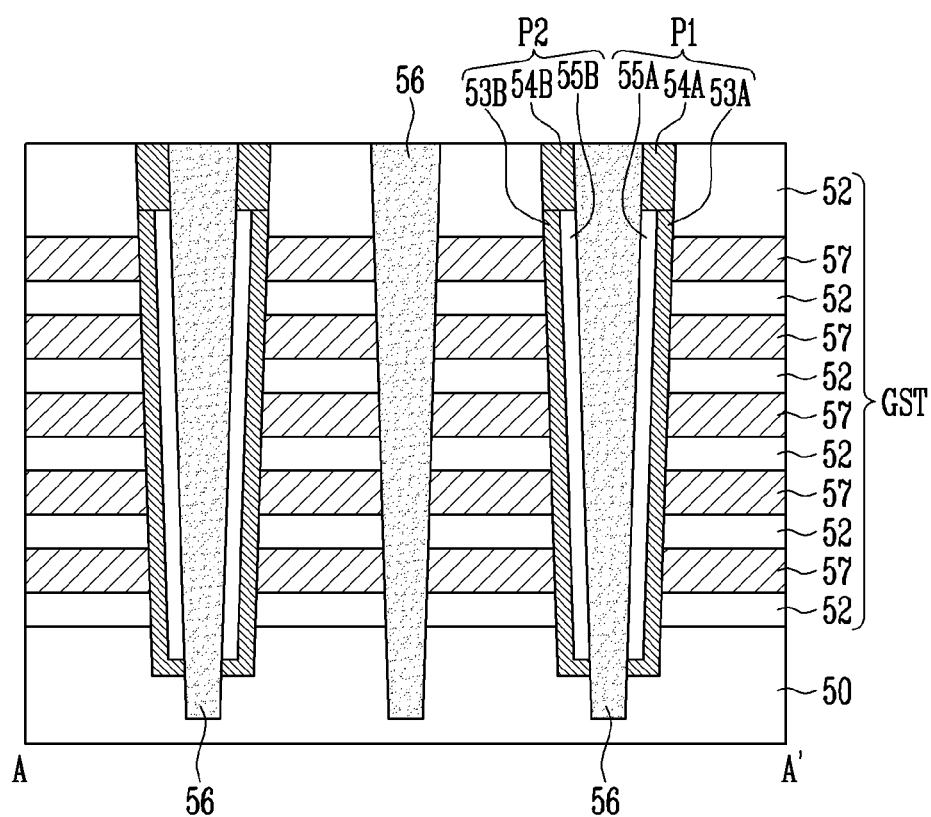

Referring to FIGS. 8A and 8B, a first slit SL1 may be formed, which penetrates the stack structure ST. The first slit SL1 may extend in a direction intersecting the first cutting structures 56. The first slit SL1 may extend in the second direction II, and be spaced apart from the first cutting structures 56. The first slit SL1 may be formed to a depth to which the first slit SL1 exposes the first material layers 51, and extend to the base 50.

Subsequently, the first material layers 51 may be replaced with third material layers 57 through the first slit SL1. In an example, when the first material layers 51 are sacrificial layers and the second material layers 52 are insulating layers, the first material layers 51 may be replaced with conductive layers. After the first material layers 51 are selectively etched, the third material layers 57 may be formed in regions in which the first material layers 51 are etched. The memory layer may be formed before the third material layers 57 are formed. In another example, when the first material layers 51 are conductive layers and the second material layers 52 are insulating layers, the first material layers 51 may be silicided. Accordingly, a gate structure GST may be formed, in which the third material layers 57 and the second material layers 52 are alternately stacked. Subsequently, a first slit structure 58 may be formed in the first slit SL1.

Figure 9A:
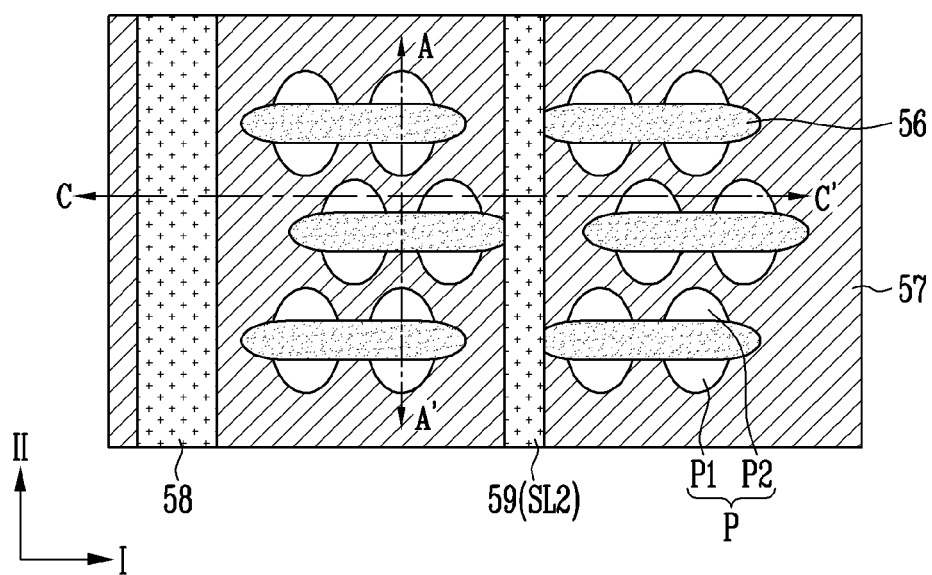
Figure 9B:
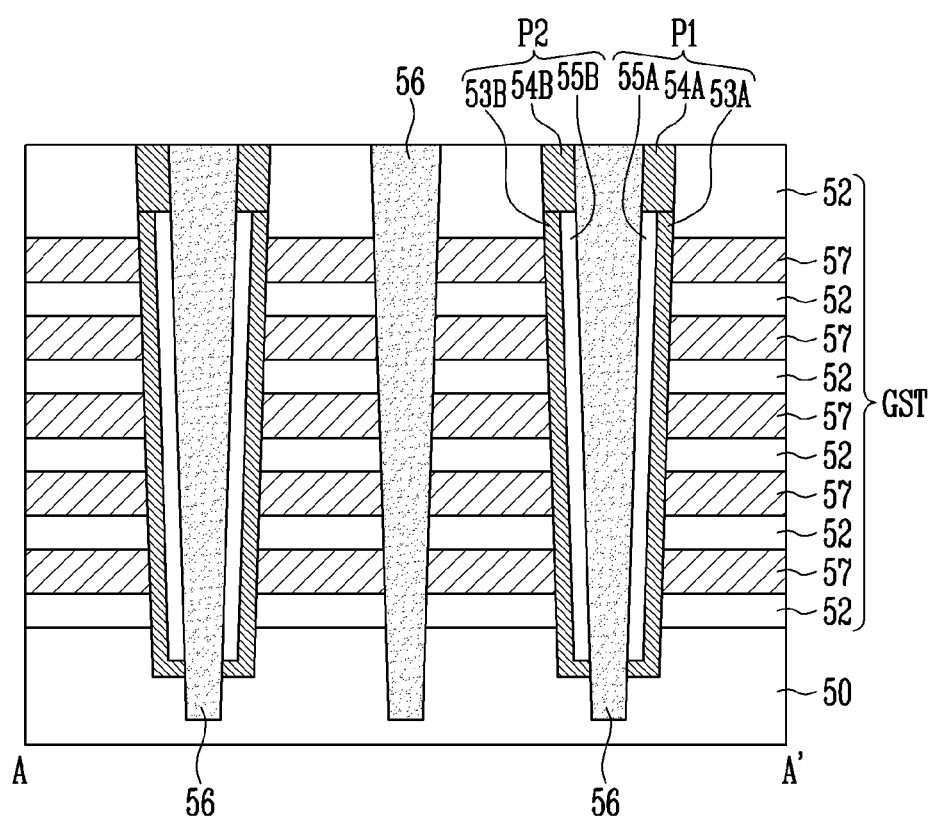
Figure 9C:
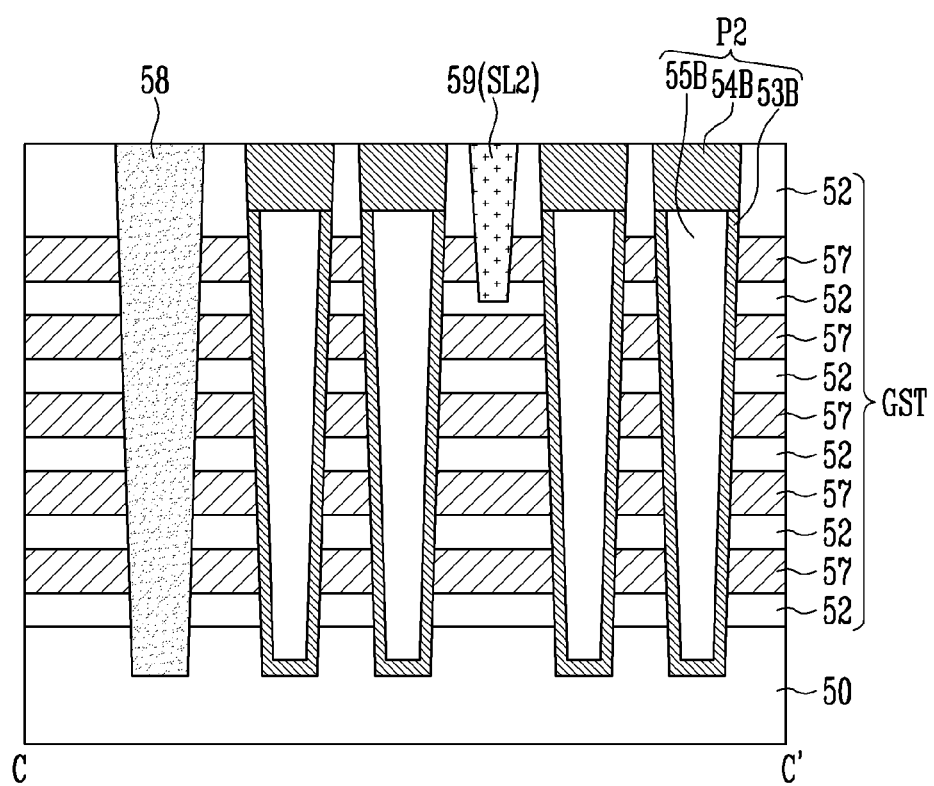

Referring to FIGS. 9A to 9C, a second slit SL2 may be formed, which penetrates the gate structure GST. The second slit SL2 may penetrate the gate structure GST to a depth shallower than a depth of the first slit structure 58 or the first cutting structure 56. The second slit SL2 may extend in the direction intersecting the first cutting structures 56, and extend in the second direction II. On a plane defined in the first direction I and the second direction II, the second slit SL2 may have a linear shape or have a zigzag shape, a wave shape, or the like.

The second slit SL2 may be formed between the pillar structures P. When the second slit SL2 is formed, the first cutting structure 56 or the pillar structure P may be etched together with the stack structure ST. Therefore, the first cutting structure 56 or the pillar structure P may be exposed through the second slit SL2. The second slit SL2 may be formed to traverse the first cutting structure 56. By the second slit SL2, one first cutting structure 56 may be isolated into a plurality of patterns.

Subsequently, a second slit structure 59 may be formed in the second slit SL2. The second slit structure 59 may include an insulating material. By the second slit structure 59, at least one third material layer 57 at an uppermost portion among the third material layers 57 may be isolated into a plurality of patterns. The second slit structure 59 may be in contact with a first cutting structure 56 or a pillar structure P, which is at the periphery thereof.

According to the manufacturing method described above, one pillar structure P can be isolated into a plurality of pillar structures P1 and P2 by using the first cutting structure 56. Thus, the number of memory cells implemented with one pillar structure P can be increased. In addition, the second slit SL2 is formed in a direction intersecting the first cutting structure 56, so that a process of replacing the first material layers 51 with the third material layers 57 can be improved.

Figure 10A:
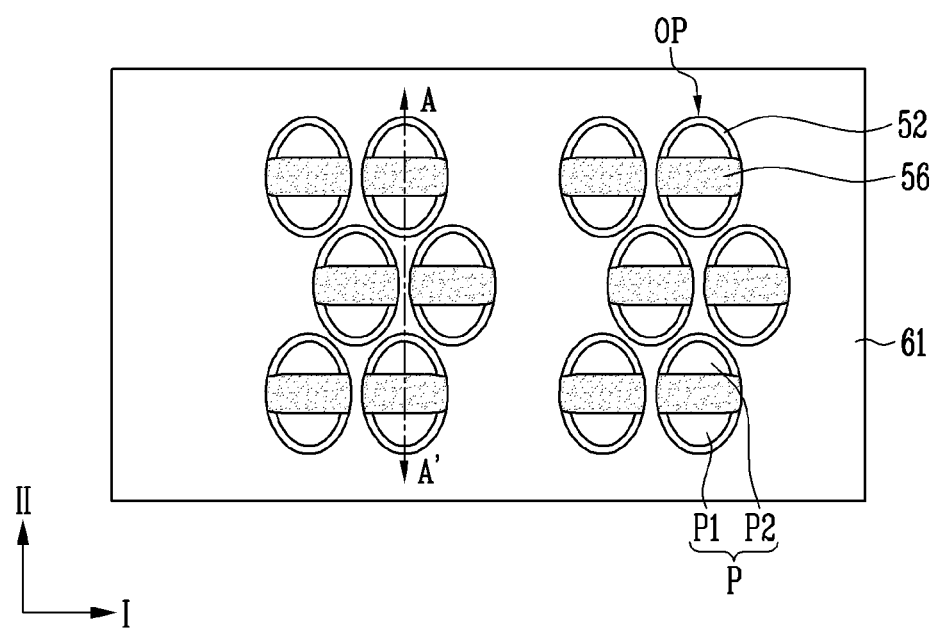
Figure 10B:
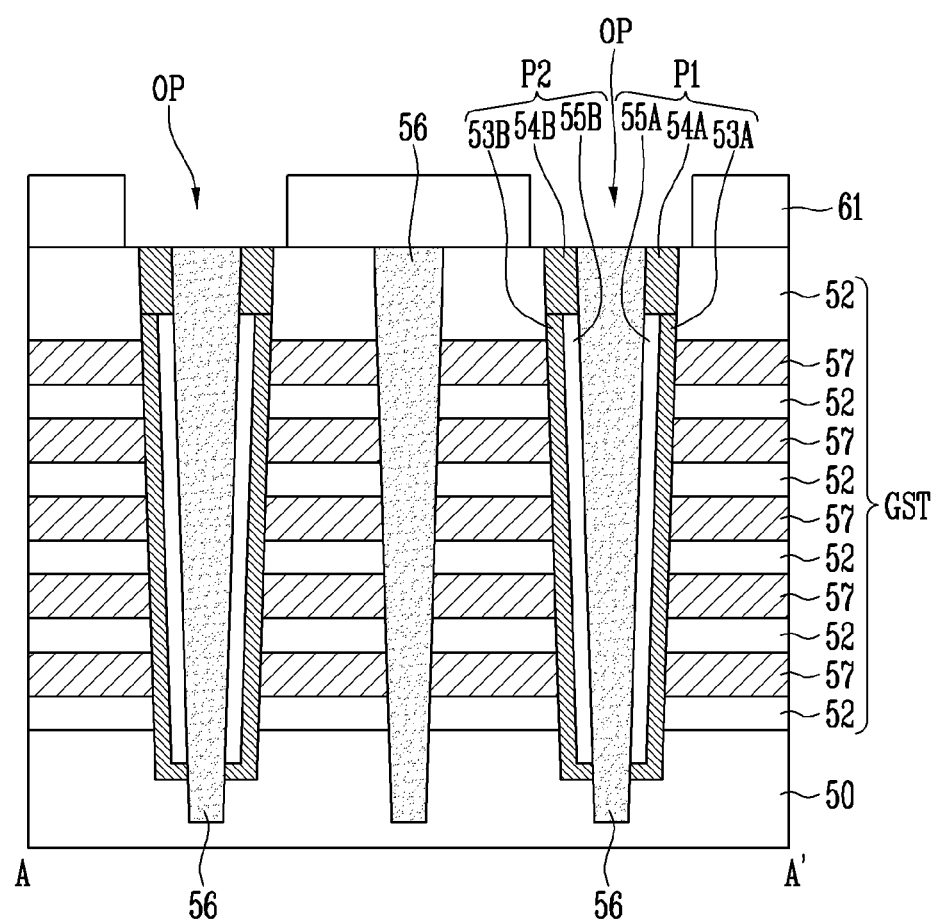

Referring to FIGS. 10A and 10B, an interlayer insulating layer 61 may be formed on the top of the gate structure GST, and a plurality of openings OP may be formed by etching the interlayer insulating layer 61. The interlayer insulating layer 61 may include an oxide layer. Each of the plurality of openings OP may correspond to one pillar structure P. Each of the plurality of openings OP may expose a pair of pillar structures P1 and P2 and a portion of the first cutting structure 56 isolating the pair of pillar structures P1 and P2 from each other. Each of the plurality of openings OP may have a critical dimension equal to or greater than a critical dimension of one pillar structure P.

Figure 11A:
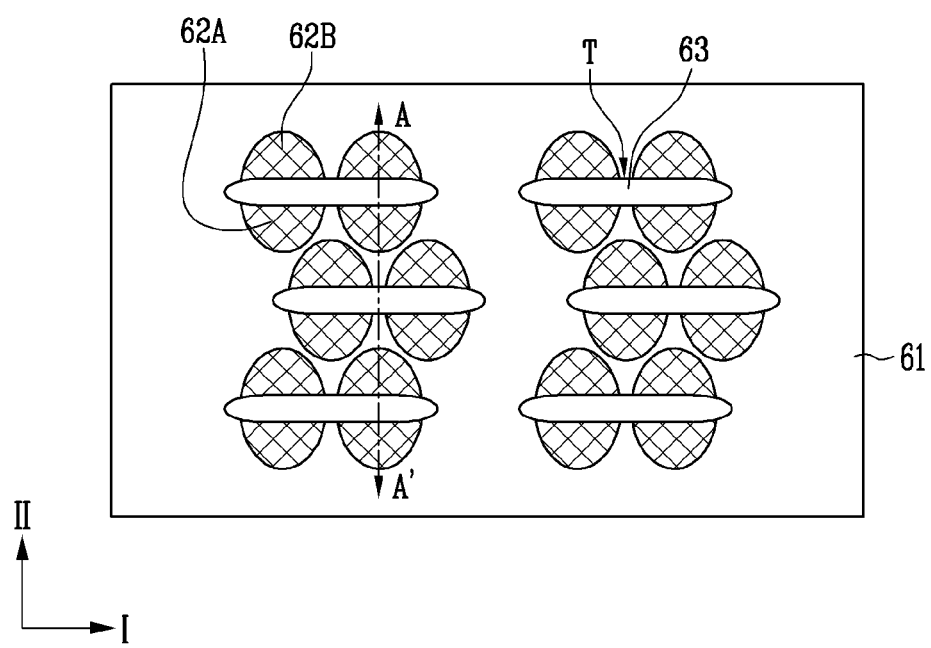
Figure 11B:
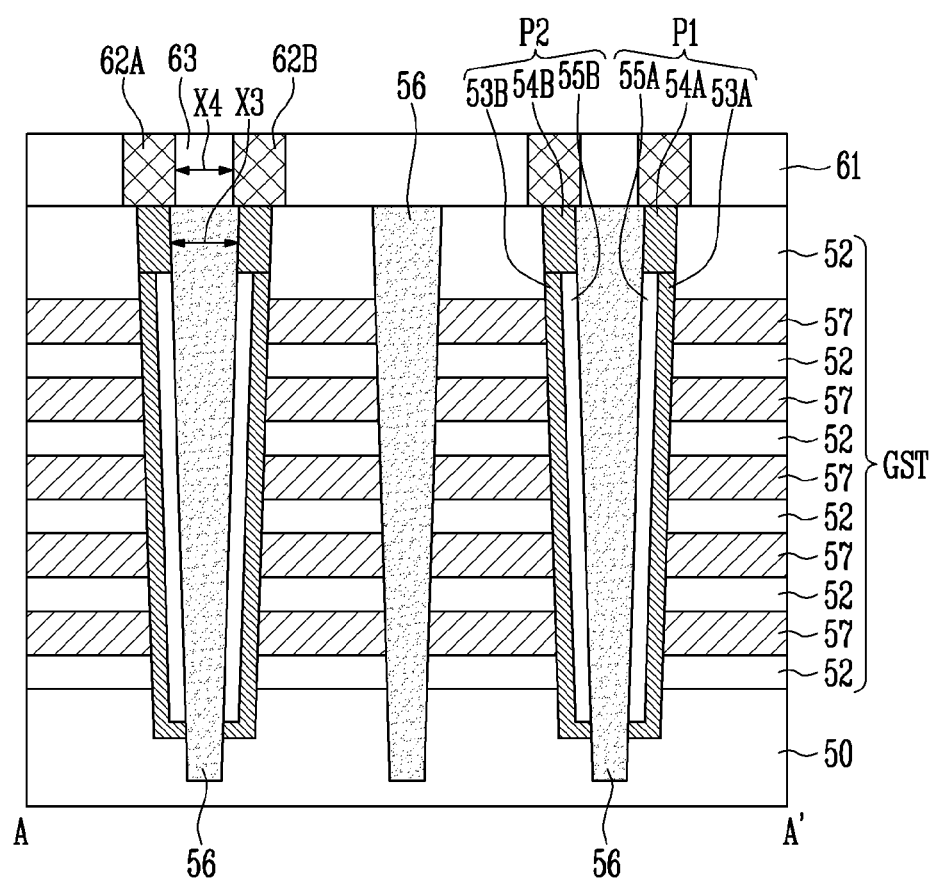

Referring to FIGS. 11A and 11B, conductive patterns may be formed by filling the plurality of openings OP shown in FIG. 10A with a conductive material, and second cutting structures 63 may be formed, which penetrate the conductive patterns. Each of the second cutting structures 63 may extend in the first direction I while penetrating at least two conductive patterns. A width X4 of each of the second cutting structures 63 in the second direction II may be narrower than a width X3 of each of the first cutting structures 56 in the second direction II. By the second cutting structures 63, each of the conductive patterns may be isolated into a first contact pad 62A and a second contact pad 62B. Each of the first contact pad 62A and the second contact pad 62B may have a critical dimension greater than a critical dimension of the first pillar structure P1 and the second pillar structure P2, which are connected to a lower surface thereof.

In an embodiment, trenches T may be formed, which penetrate the conductive patterns and the interlayer insulating layers 61, which are disposed on the top of the first cutting structures 56. The trenches T may extend in the first direction I, and penetrate at least two conductive patterns. Subsequently, the second cutting structures 63 may be respectively formed in the trenches T. The second cutting structures 63 are used to isolate the first contact pad 62A and the second contact pad 62B from each other, and may include an insulating material.

Subsequently, although not shown in these drawings, interconnection lines may be formed, which are connected to the first contact pad 62A and the second contact pad 62B. In an embodiment, contact plugs may be formed, which are respectively connected to the first contact pad 62A and the second contact pad 62B, and bit lines may be formed, which extend in the first direction I and are respectively connected to the contact plugs. In a process of forming the contact plugs, an overlapping margin with the contact plugs can be increased by the first contact pad 62A and the second contact pad 62B, which have a critical dimension greater than the critical dimension of the first pillar structure P1 and the second pillar structure P2.

For an embodiment of the present disclosure, it has been described that one first cutting structure penetrates two pillar structures adjacent to each other. However, one first cutting structure may penetrate one pillar structure, or penetrate at least three pillar structures.

FIGS. 12A, 12B, 13A, 13B, 14A, and 14B are views illustrating a manufacturing method of a semiconductor device in accordance with another embodiment of the present disclosure.

In a manufacturing method of the semiconductor device in accordance with the another embodiment of the present disclosure, a gate structure GST, pillar structures P, and first and second cutting structures CS1 and CS2 may be formed by performing the same processes as shown in FIGS. 6A, 6B, 7A, 7B, 8A, 8B, 9A, 9B, and 9C. Accordingly, detailed descriptions of the processes of forming the gate structure GST, the pillar structures P, and the first and second cutting structures CS1 and CS2 will not be repeated, and processes after FIGS. 6A, 6B, 7A, 7B, 8A, 8B, 9A, 9B, and 9C will be described.

Figure 12A:
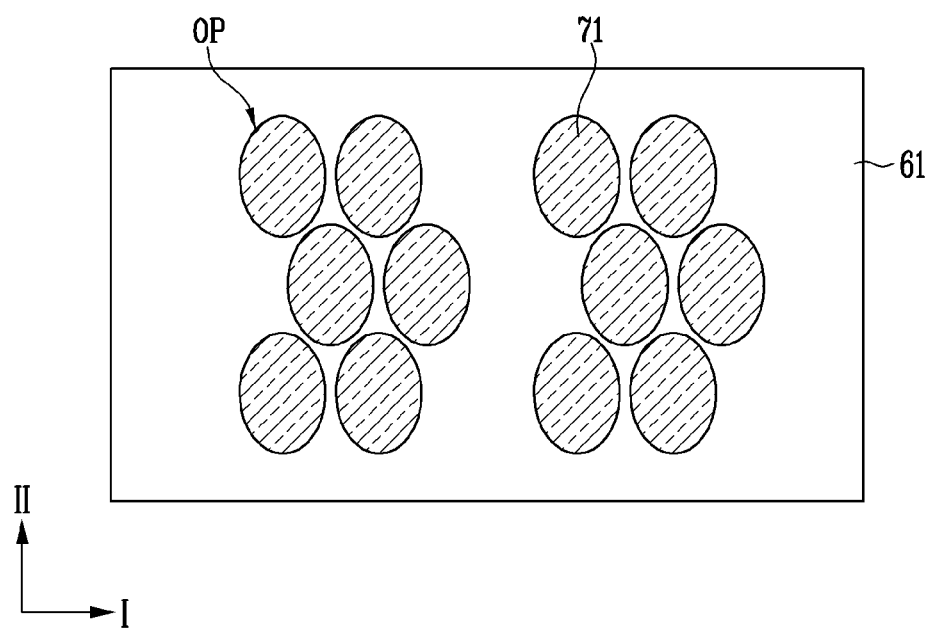
FIGS. 12A, 12B, 13A, 13B, 14A, and 14B are views illustrating a manufacturing method of a semiconductor device in accordance with another embodiment of the present disclosure.
Figure 12B:
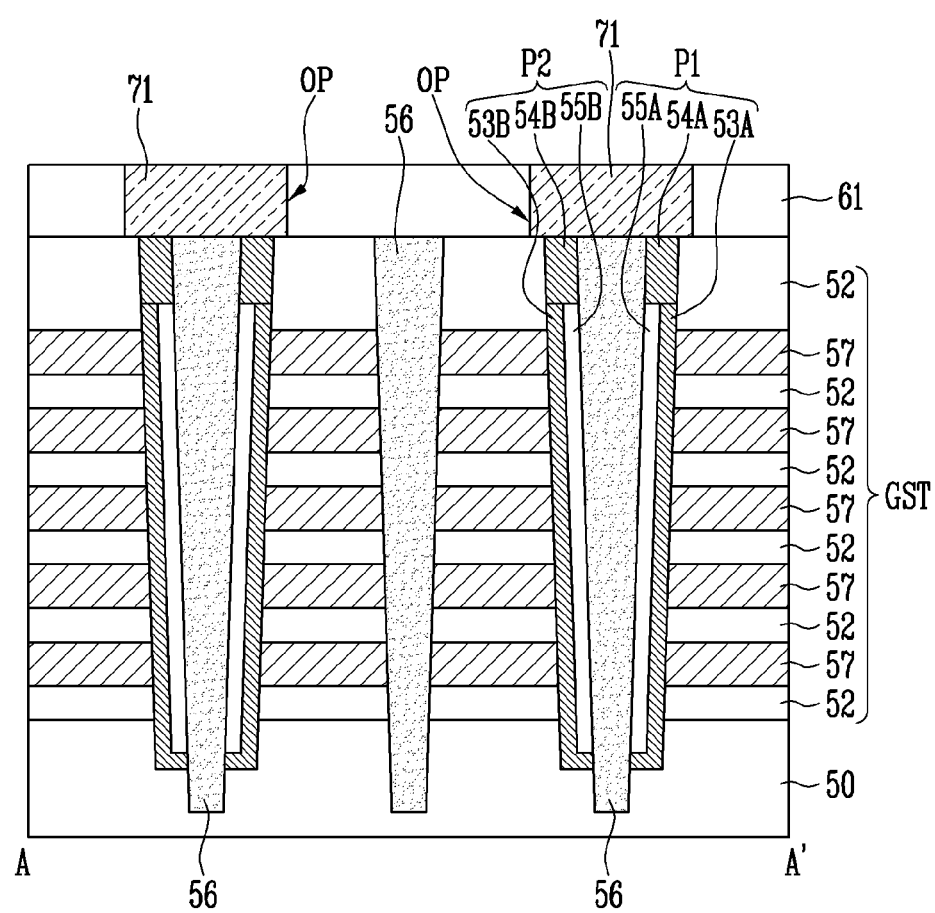

Referring to FIGS. 12A and 12B, an interlayer insulating layer 61 may be formed on the top of the gate structure GST, and a plurality of openings OP may be formed by etching the interlayer insulating layer 61. The interlayer insulating layer 61 may include an oxide layer. Each of the plurality of openings OP may correspond to one pillar structure P. Each of the plurality of openings OP may expose a pair of pillar structures P1 and P2 and a portion of a first cutting structure 56 isolating the pair of pillar structures P1 and P2 from each other. Each of the plurality of openings OP may have a critical dimension equal to or greater than a critical dimension of one pillar structure P.

Subsequently, a sacrificial pattern 71 may be formed in the plurality of openings OP. The sacrificial pattern 71 may include a nitride.

Figure 13A:
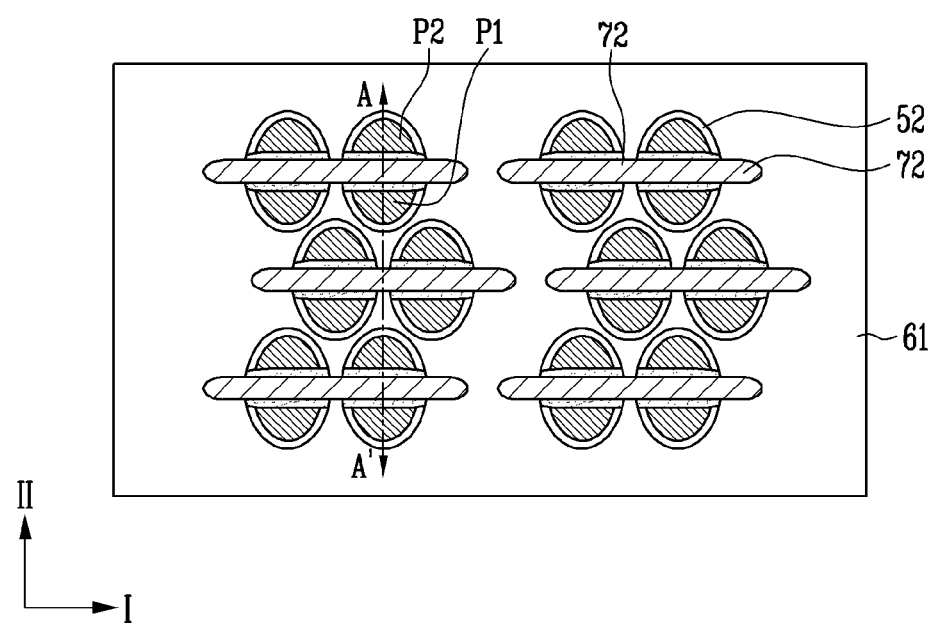
Figure 13B:
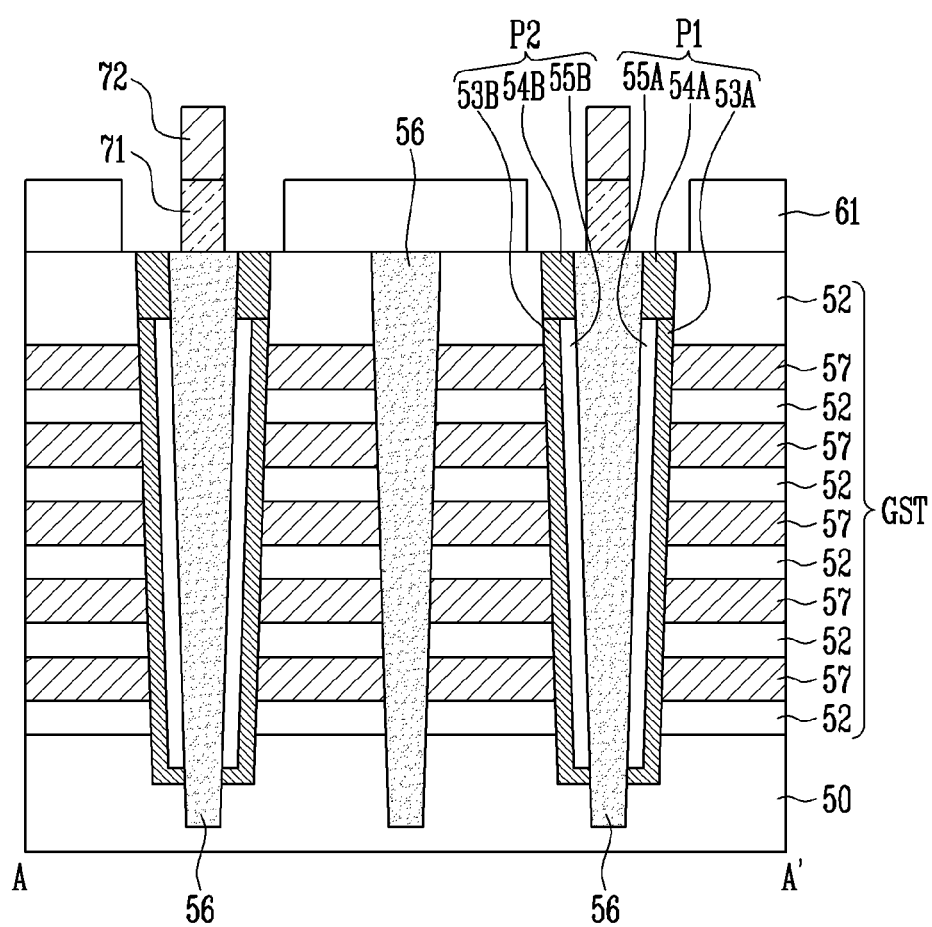

Referring to FIGS. 13A and 13B, mask patterns 72 may be formed, which overlap with at least two sacrificial patterns 71 adjacent to each other in the first direction I to extend in the first direction I. The mask patterns 72 may be formed as photoresist patterns. A width of the mask patterns 72 in the second direction II may be narrower than a width of each of first cutting structures 56 in the second direction II.

Subsequently, a first pillar structure P1 and a second pillar structure P2 on the bottom of the sacrificial pattern 71 may be exposed by etching the sacrificial pattern 71 by performing an etching process using the mask patterns 72 as an etching mask.

Figure 14A:
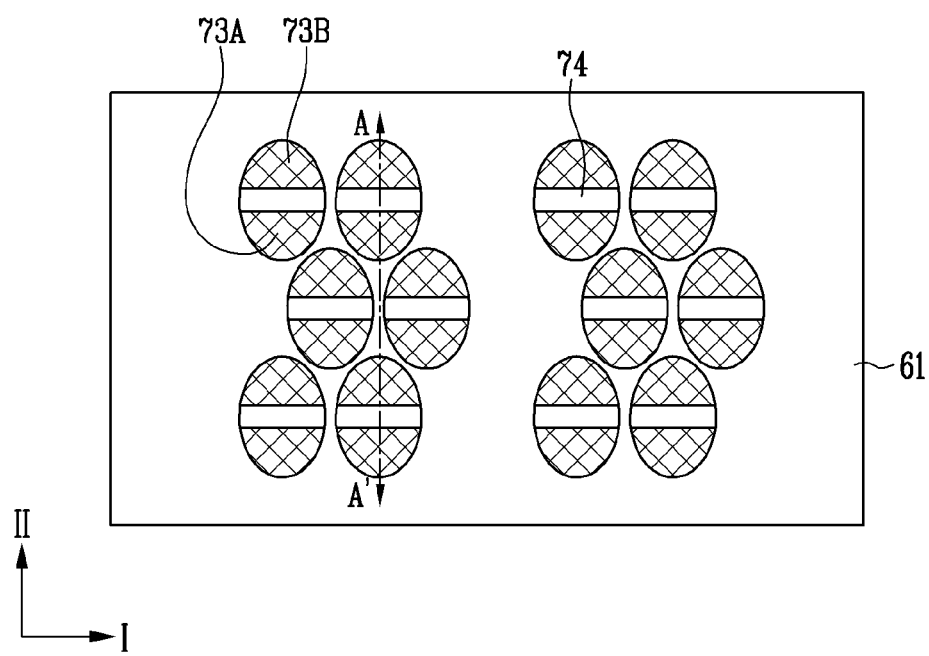
Figure 14B:
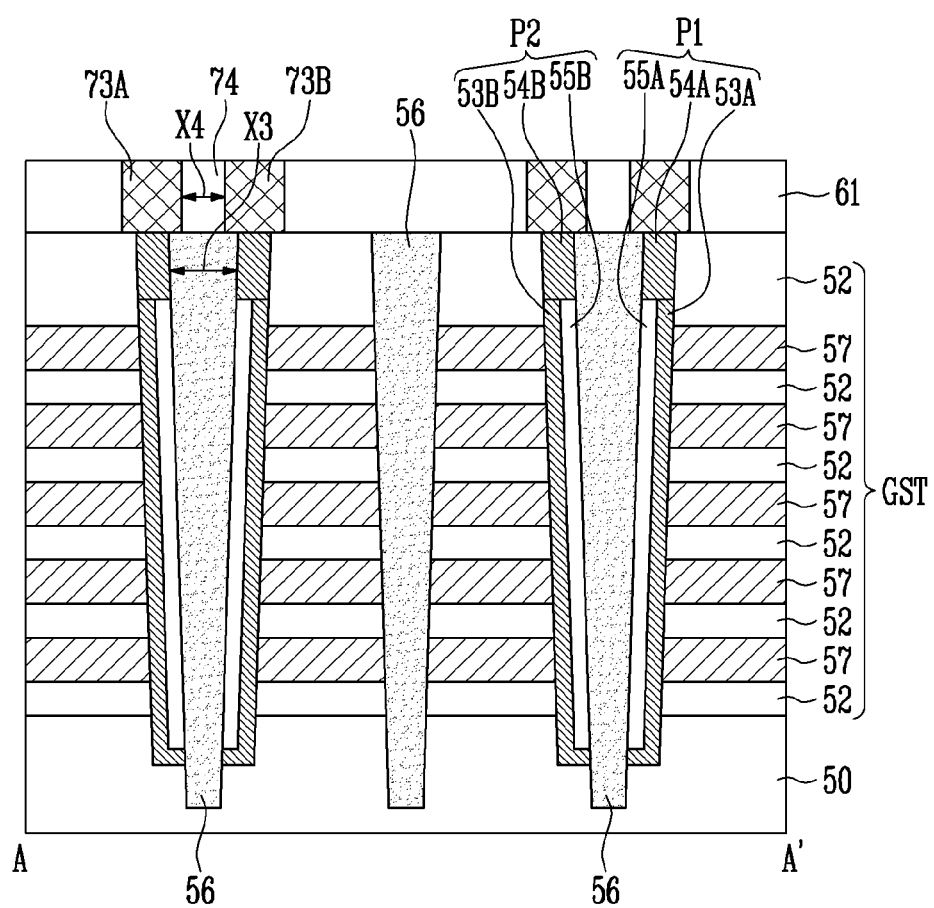

Referring to FIGS. 14A and 14B, a first contact pad CT1 and a second contact pad CT2 may be formed by removing the mask patterns and filling a conductive material in an opening formed by etching the sacrificial pattern. Subsequently, second cutting structures 74 may be formed by removing the remaining sacrificial pattern and filling an insulating material in a space in which the sacrificial pattern is removed. Each of the second cutting structures 74 may be disposed on the top of each of the first cutting structures 56, and electrically isolate a pair of first and second contact pads CT1 and CT2 from each other. One second cutting structure 74 may correspond to a pair of first and second contact pads CT1 and CT2, and is not in contact with another pair of first and second contact pads CT1 and CT2 adjacent to the pair of first and second contact pads CT1 and CT2 in the first direction I. A width X4 of each of the second cutting structures 74 in the second direction II may be narrower than a width X3 of each of the first cutting structure 56 in the second direction II. A first contact pad 73A and a second contact pad 73B may be isolated from each other by the second cutting structures 74, and each of the first contact pad 73A and the second contact pad 73B may have a critical dimension greater than a critical dimension of a first pillar structure P1 and a second pillar structure P2, which are connected to a lower surface thereof.

Figure 15:
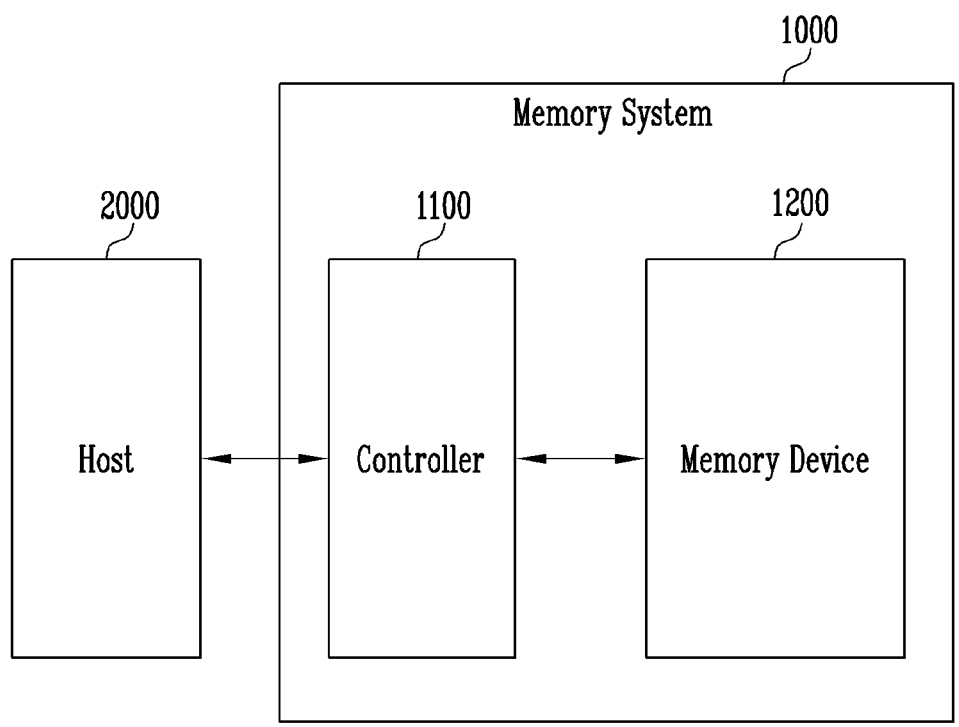
FIG. 15 is a block diagram illustrating a memory system in accordance with an embodiment of the present disclosure.

FIG. 15 is a diagram illustrating a memory system 1000 in accordance with an embodiment of the present disclosure.

Referring to FIG. 15, the memory system 1000 may include a memory device 1200 configured to store data and a controller 1100 configured to communicate between the memory device 1200 and a host 2000.

The host 2000 may be a device or system which stores data in the memory system 1000 or retrieves data from the memory system 1000. The host 2000 may generate requests for various operations, and output the generated requests to the memory system 1000. The requests may include a program request for a program operation, a read request for a read operation, an erase request for an erase operation, and the like. The host 2000 may communicate with the memory system 1000 through various interfaces such as Peripheral Component Interconnect-Express (PCI-E), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

The host 2000 may include at least one of a computer, a portable digital device, a tablet PC, a digital camera, a digital audio player, a television, a wireless communication device, and a cellular phone, but embodiments of the present disclosure are not limited thereto.

The controller 1100 may control overall operations of the memory system 1000. The controller 1100 may control the memory device 1200 according to a request of the host 2000. The controller 1100 may control the memory device 1200 to perform a program operation, a read operation, an erase operation, and the like according to a request of the host 2000. Alternatively, the controller 1100 may perform a background operation, etc. for improving the performance of the memory system 1000 without any request of the host 2000.

The controller 1100 may transmit a control signal and a data signal to the memory device 1200 so as to control an operation of the memory device 1200. The control signal and the data signal may be transmitted to the memory device 1200 through different input/output lines. The data signal may include a command, an address, or data. The control signal may be used to distinguish a period in which the data signal is input.

The memory device 1200 may perform a program operation, a read operation, an erase operation, and the like under the control of the controller 1100. The memory device 1200 may be implemented with a volatile memory device in which stored data disappears when the supply of power is interrupted or a nonvolatile memory device in which stored data is retained even when the supply of power is interrupted. The memory device 1200 may be a semiconductor device having the structure described above with reference to FIGS. 2A to 2D, 3A and 3B, 4A and 4B, and 5. The memory device 1200 may be a semiconductor device manufactured by the manufacturing method described above with reference to FIGS. 6A, 6B, 7A, 7B, 8A, 8B, 9A, 9B, 9C, 10A, 10B, 11A, and 11B or a semiconductor device manufactured by the manufacturing method described above with reference to FIGS. 6A, 6B, 7A, 7B, 8A, 8B, 9A, 9B, 9C, 10A, 10B, 13A, 13B, 14A, and 14B.

Figure 16:
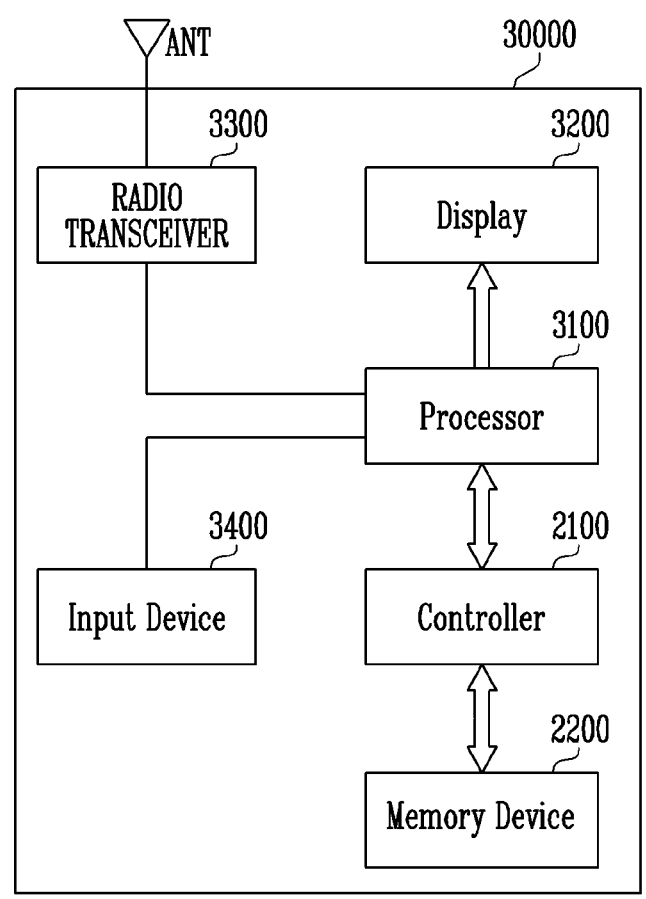
FIG. 16 is a block diagram illustrating a memory system in accordance with an embodiment of the present disclosure.

FIG. 16 is a diagram illustrating a memory system 30000 in accordance with an embodiment of the present disclosure.

Referring to FIG. 16, the memory system 30000 may be implemented as a cellular phone, a smart phone, a tablet PC, a personal digital assistant (PDA), or a wireless communication device. The memory system 30000 may include a memory device 2200 and a controller 2100 capable of controlling an operation of the memory device 2200.

The controller 2100 may control a data access operation of the memory device 2200, e.g., a program operation, an erase operation, a read operation, or the like under the control of a processor 3100.

Data programmed in the memory device 2200 may be output through a display 3200 under the control of the controller 2100.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the controller 2100 or the display 3200. The controller 2100 may transmit the signal processed by the processor 3100 to the memory device 2200. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mouse, a keypad, or a keyboard. The processor 3100 may control an operation of the display 3200 such that data output from the controller 2100, data output from the radio transceiver 3300, or data output from the input device 3400 can be output through the display 3200.

In some embodiments, the controller 2100 is capable of controlling an operation of the memory device 2200 and may be implemented as a part of the processor 3100, or be implemented as a chip separate from the processor 3100.

Figure 17:
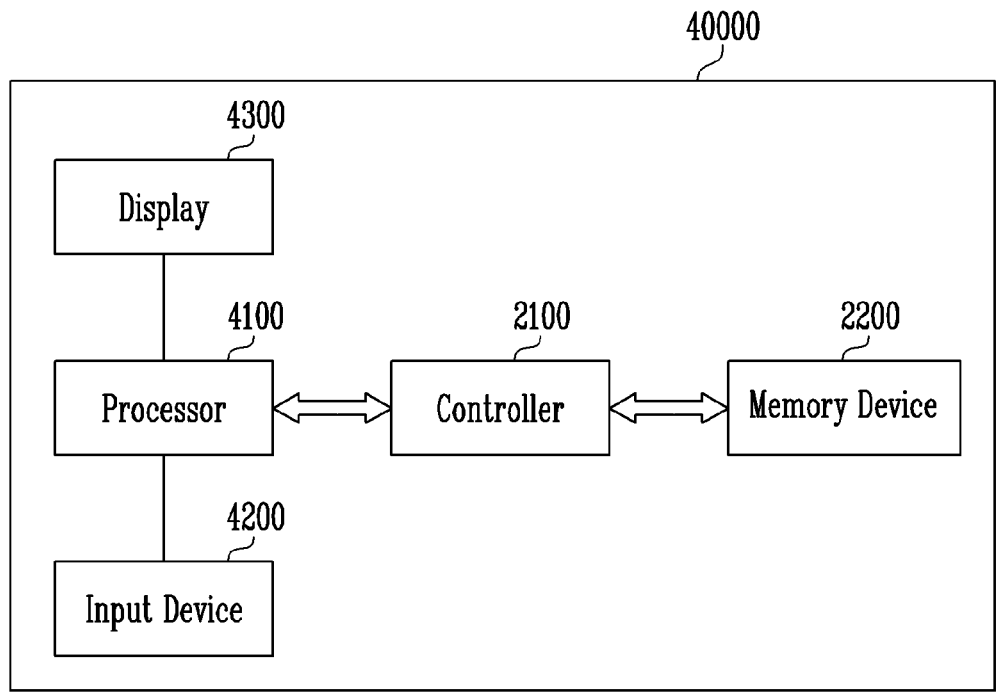
FIG. 17 is a block diagram illustrating a memory system in accordance with an embodiment of the present disclosure.

FIG. 17 is a diagram illustrating a memory system 40000 in accordance with an embodiment of the present disclosure.

Referring to FIG. 17, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 2200 and a controller 2100 capable of controlling a data processing operation of the memory device 2200.

A processor 4100 may output data stored in the memory device 2200 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the controller 2100. In some embodiments, the controller 2100 is capable of controlling an operation of the memory device 2200 and may be implemented as a part of the processor 4100, or be implemented as a chip separate from the processor 4100.

Figure 18:
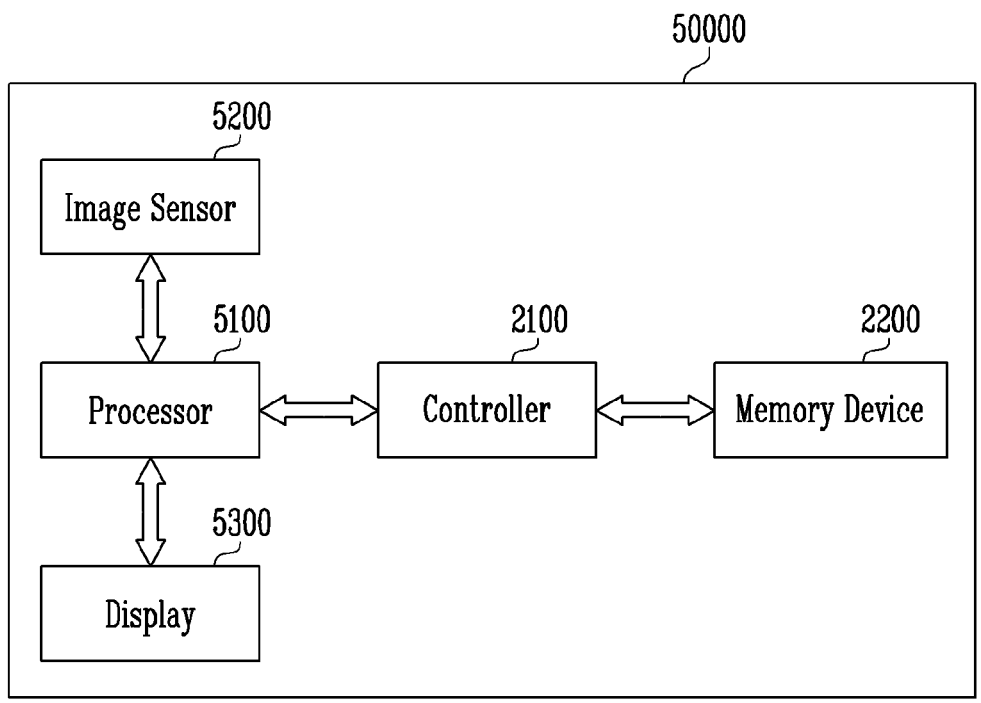
FIG. 18 is a block diagram illustrating a memory system in accordance with an embodiment of the present disclosure.

FIG. 18 is a diagram illustrating a memory system 50000 in accordance with an embodiment of the present disclosure.

Referring to FIG. 18, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 2200 and a controller 2100 capable of controlling a data processing operation of the memory device 2200, e.g., a program operation, an erase operation, or a read operation.

An image sensor 5200 of the memory system 50000 may convert an optical image into digital signals, and the converted digital signals may be transmitted to a processor 5100 or the controller 2100. Under the control of the processor 5100, the converted digital signals may be output through a display 5300, or be stored in the memory device 2200 through the controller 2100. In addition, data stored in the memory device 2200 may be output through the display 5300 under the control of the processor 5100 or the controller 2100.

In some embodiments, the controller 2100 capable of controlling an operation of the memory device 2200 may be implemented as a part of the processor 5100, or be implemented as a chip separate from the processor 5100.

Figure 19:
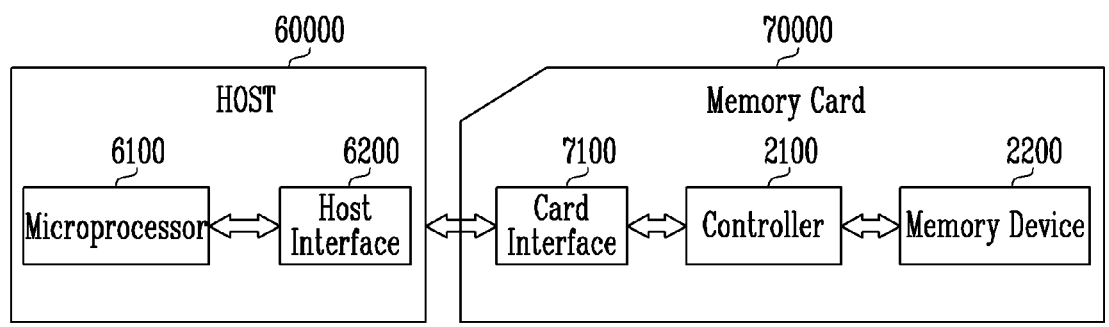
FIG. 19 is a block diagram illustrating a memory system in accordance with an embodiment of the present disclosure.

FIG. 19 is a diagram illustrating a memory system 70000 in accordance with an embodiment of the present disclosure.

Referring to FIG. 19, the memory system 70000 may be implemented as a memory card or a smart card. The memory system 70000 may include a memory device 2200, a controller 2100, and a card interface 7100.

The controller 2100 may control data exchange between the memory device 2200 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the controller 2100 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the controller 2100 under the control of a microprocessor 6100.

In accordance with an embodiment of the present disclosure, a contact pad having a critical dimension greater than a critical dimension of a channel structure is disposed on the channel structure, so that a process margin of the semiconductor device can be increased.

While the present disclosure has been shown and described with reference to some embodiments, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed and/or some steps and may be omitted. In each embodiment, steps need not necessarily be performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor device comprising:
    a gate structure including conductive layers and insulating layers, which are alternately stacked;
    a channel structure including a first channel structure and a second channel structure aligned in a first direction, and the channel structure penetrating the gate structure,
    a first cutting structure extending in a second direction, the first cutting structure disposed between the first channel structure and the second channel structure;
    a contact pad including a first contact pad in contact with an upper surface of the first channel structure, and a second contact pad in contact with an upper surface of the second channel structure;
    a second cutting structure in contact with an upper surface of the first cutting structure and disposed between the first contact pad and the second contact pad,
    wherein the first contact pad has a critical dimension greater than a critical dimension of the upper surface of the first channel structure.

2. The semiconductor device of claim 1, wherein the second cutting structure has a critical dimension smaller than the critical dimension of the upper surface of the first cutting structure.

3. The semiconductor device of claim 1, wherein the first channel structure and the second channel structure are isolated from each other by the first cutting structure.

4. The semiconductor device of claim 3, wherein the first contact pad and the second contact pad are isolated from each other by the second cutting structure.

5. The semiconductor device of claim 4, wherein a critical dimension of the second contact pad is greater than a critical dimension of the upper surface of the second channel structure.

6. The semiconductor device of claim 1, further comprising:
    a contact plug connected to one of the first contact pad and the second contact pad; and
    a bit line connected to the contact plug.

7. The semiconductor device of claim 1, further comprising a first slit structure penetrating the gate structure, the first slit structure extending in a second direction intersecting the first direction.

8. The semiconductor device of claim 7, further comprising a second slit structure penetrating the gate structure to a depth shallower than a depth of the first slit structure or the first cutting structure, the second slit structure extending in the second direction.

9. The semiconductor device of claim 7, further comprising a second slit structure penetrating the gate structure and the first cutting structure to a depth shallower than a depth of the first slit structure or the first cutting structure, the second slit structure extending in the second direction.

10. The semiconductor device of claim 3, wherein the first channel structure and the second channel structure create a symmetrical structure with respect to the first cutting structure.

11. The semiconductor device of claim 4, wherein the first contact pad and the second contact pad create a symmetrical structure with respect to the second cutting structure.

12. A semiconductor device comprising:
a gate structure including conductive layers and insulating layers, which are alternately stacked;
a pillar structure penetrating the gate structure;
a first cutting structure penetrating the pillar structure, the first cutting structure separating the pillar structure into a first pillar structure and a second pillar structure isolated from the first pillar structure;
a first contact pad in contact with an upper surface of the first pillar structure, the first contact pad having a critical dimension greater than a critical dimension of the upper surface of the first pillar structure;
a second contact pad in contact with an upper surface of the second pillar structure, the second contact pad having a critical dimension greater than a critical dimension of the upper surface of the second pillar structure; and
a second cutting structure disposed between the first contact pad and the second contact pad to isolate the first contact pad and the second contact pad from each other,
wherein the second cutting structure is disposed on the top of the first cutting structure, and a critical dimension of the second cutting structure is smaller than a critical dimension of the first cutting structure.

13. The semiconductor device of claim 12, comprising:
a first slit structure penetrating the gate structure, the first slit structure extending in a direction intersecting a direction in which the first cutting structure extends;
a first interconnection line extending in a direction intersecting the direction in which the first slit structure extends, the first interconnection line being connected to the first contact pad; and
a second interconnection line extending in the direction intersecting the direction in which the first slit structure extends, the second interconnection line being connected to the second contact pad.

14. The semiconductor device of claim 12, further comprising an interlayer insulating layer formed on the top of the gate structure,
wherein the first contact pad and the second contact pad are disposed in and penetrate the interlayer insulating layer.

15. The semiconductor device of claim 12, wherein the first pillar structure and the second pillar structure create a symmetrical structure with respect to the first cutting structure.

16. The semiconductor device of claim 12, wherein the first contact pad and the second contact pad create a symmetrical structure with respect to the second cutting structure.

17. The semiconductor device of claim 13, further comprising a second slit structure penetrating the gate structure to a depth shallower than a depth of the first slit structure.

* * * * *